United States Patent [19]
Kang

[11] Patent Number: 6,091,622
[45] Date of Patent: *Jul. 18, 2000

[54] NONVOLATILE FERROELECTRIC MEMORY DEVICE

[75] Inventor: Hee Bok Kang, Daejeon-si, Rep. of Korea

[73] Assignee: LG Semicon Co., Ltd., Cheongju, Rep. of Korea

[*] Notice: This patent is subject to a terminal disclaimer.

[21] Appl. No.: 09/210,783

[22] Filed: Dec. 15, 1998

Related U.S. Application Data

[63] Continuation-in-part of application No. 09/187,735, Nov. 9, 1998, which is a continuation-in-part of application No. 09/055,985, Apr. 7, 1998.

[30] Foreign Application Priority Data

Dec. 12, 1997 [KR] Rep. of Korea ............ 97-68192
Apr. 22, 1998 [KR] Rep. of Korea ............ 98-14400
May 13, 1998 [KR] Rep. of Korea ............ 98-17212

[51] Int. Cl.[7] ............ G11C 11/22; G11C 11/24; G11C 8/00
[52] U.S. Cl. ............ 365/145; 365/149; 365/230.06
[58] Field of Search ............ 365/145, 149, 365/230.06

[56] References Cited

U.S. PATENT DOCUMENTS

| | | | |
|---|---|---|---|
| 5,373,463 | 12/1994 | Jones, Jr. | 365/145 |
| 5,815,430 | 9/1998 | Verhaeghe et al. | 365/145 |
| 5,903,492 | 5/1999 | Takashima | 365/145 |

*Primary Examiner*—Trong Phan
*Attorney, Agent, or Firm*—Fleshner & Kim, LLP

[57] ABSTRACT

The ferroelectric memory device of the present invention controls the data input and output timing in the memory by a combination of the changes of X, Y, Z addresses and chip enable signals so that the ferroelectric memory device is enabled. The ferroelectric memory device includes a plurality of bitlines and a plurality of bitbarlines intersect a plurality of split wordlines, which comprises of a pair of a first split wordline and a second split wordline. A plurality of memory cells are formed between the first and second split wordlines, and a timing controller controls the data input and output timing of the memory cells according to the changes of the X, Y, Z addresses and the chip enable signals.

46 Claims, 20 Drawing Sheets

E : electric field
P : polarity ferroelectric capacitor reference voltage

NONVOLATILE FERROELECTRIC MEMORY DEVICE

This application is a continuation-in-part of application Ser. No. 09/187,735 filed Nov. 9, 1998, which is a continuation-in-part of application Ser. No. 09/055,985 filed Apr. 7, 1998.

BACKGROUND OF THE INVENTION

1. Field of the Invention

The present invention relates to a memory device, more particularly, to a ferroelectric memory device.

2. Background of the Related Art

A ferroelectric random access memory FRAM) has a data processing speed as fast as a DRAM and conserves data even after the power is turned off. The FRAM includes capacitors similar to the 45DRAM, but the capacitors have a ferroelectric substance for utilizing the characteristic of a high residual polarization of the ferroelectric substance in which data is not lost even after eliminating an electric field applied thereto.

FIG. 1A illustrates a general hysteresis loop of a ferroelectric substance, and FIG. 1B illustrates a construction of a unit capacitor in a background art ferroelectric memory, As shown in the hysteresis loop in FIG. 1A, a polarization induced by an electric field does not vanish, but remains at a certain portion ("d" or "a" state) even after the electric field is cleared due to an existence of a spontaneous polarization. These "d" and "a" states may be matched to binary values of "1" and "0" for use as a memory cell. Referring to FIG. 1B, the state in which a positive voltage is applied to a node 1 is a "c" state in FIG. 1A, the state in which no voltage is applied thereafter to the node 1 is a "d" state. Opposite to this, if a negative voltage is applied to the node 1, the state moves from the "d" to an "f" state. If no voltage is applied to the node 1, thereafter the state moves to an "a" state. If a positive voltage is applied again, the states moves to the "c" state via the "b" state. At the end, even if there is no voltage applied on both ends of a capacitor, a data can be stored in stable states of "a" and "d". On the hysteresis loop, "c" and "d" states correspond to a binary logic value of "1", and "a" and "f" states correspond to a binary logic value "a".

In reading a data from the capacitor, the "d" state is destroyed to read the data stored in the capacitor. In a background art, a sense amplifier is used for reading a data using a voltage generated in a reference voltage generator and a voltage generated in a main cell array. In a ferroelectric reference cell, two modes of "1" polarity and "0" polarity are used for generating a reference voltage on a reference bitline. Accordingly, the sense amplifier compares a bitline voltage on a main cell and a reference bitline voltage on a reference cell, to read information in the main cell. By rewriting the read data within the same cycle, the destroyed data can be recovered.

Referring to FIG. 2, the array of the background art ferroelectric memory cells, each unit memory cell having two transistors and two capacitors (2T/2C) is provided with a plurality of wordlines W/L arranged in one direction and spaced at fixed intervals. A plurality of platelines P/L are arranged parallel to the wordlines and between each of the wordlines W/L. A plurality of bitlines B_n, B_n+1 and bitbarlines BB_n, BB_n+1 are arranged alternatively and in a direction vertical to the wordlines W/L and the platelines P/L.

The gate electrodes of the two transistors T1 and T2 in a unit memory cell 21 are connected to an adjacent wordline W/L in common, and the source electrodes of the transistors T1 and T2 are connected to an adjacent bitline B_n and bitbarline BB_n, respectively. The drain electrodes of the transistors T1 and T2 are connected to the first electrodes of two capacitors, respectively, while the second electrodes of the capacitors are connected in common to an adjacent plateline P/L.

The array of the background art 2T/2C FRAM cells writes and reads a logic value "1" or "0" as follows. Referring to FIG. 3A, in a writing mode, when a chip enable signal CSBpad transits from a "high" to a "low" externally, the array is enabled, and simultaneously, a writing mode enable signal WEBpad also transits from a "high" to a "low" to provide "high" and "low" or "low" and "high" signals to the bitline and the bitbarline according to a logic value intended to be written. An address is decoded to transit a wordline signal of a selected cell from a "low" to a "high" for selecting the cell.

During an interval in which the wordline is held at a "high", a "high" signal of a fixed interval and a "low" signal of fixed interval in succession are applied to a corresponding plateline P/L. For writing a binary logic value "1", a "high" signal is applied to a bitline B_n and a "low" signal is applied to a bitbarline BB_n . For writing a binary logic value "0", a "low" signal is applied to a bitline B_n and "high" signal is applied to a bitbarline BB-n. Thus, either a logic value "1" or a logic value "0" can be written into the capacitor C1 or C2.

Referring to FIG. 3B, when a chip enable signal CSBpad transits from a "high" to a "low" and a write mode enable signal WEBpad transits from a "low" to a "high" , the write mode is deactivated and a read mode is enabled. Before selection of a required wordline, all bitlines are equalized to a "low" level by an equalization signal. After completion of the equalizing to the "low" level, an address is decoded to transit a signal on the required wordline from a "low" to a "high" for selecting a corresponding unit cell. A "high" signal is applied to a plateline of the selected cell to cancel a data on the bitline or the bitbarline.

In other words, if a logic value "1" is written, a data in a capacitor connected to the bitline will be destroyed, and if a logic value "0" is written, a data in a capacitor connected to the bitbarline will be destroyed. Thus, depending on the data destroyed on the bitline or on the bitbarline, a value different from each other is provided according to the hysteresis loop characteristics. When the data provided through either the bitline or the bitbarline is sensed by the sense amplifier, the data value will be either logic "1" or logic "0". After the sense amplifier amplifies and provides the data, since the cell should have the data recovered, during the required wordline is applied of "high" , the plateline is disabled from a "high" to a "low".

In spite of its merit that a stored data is kept when the power is off, the conventional FRAM has a complex layout because of their separated plate lines, and therefore, the manufacturing process is also complicated. Further, the speed of the conventional FRAM decreases because the data input and output operations are done by the separated plate lines, and a control signal is applied to the plate lines for the data read and write operations.

The integration in the conventional ferroelectric memory cell also cannot be improved without developing a new electric material or a new barrier material.

Another important factor causing a serious problem in the integration is that the area of a FRAM is larger than that of DRAM having the same capacity since a capacitor cannot be formed on a silicon substrate or on a surface of polysilicon because of lack of technique forming a ferroelectric layer on a surface of silicon. Moreover, it is difficult to exactly control the operation of the memory device since the wordline and the plate line are separately controlled, and therefore, there is a difference between control signals according to the transmission path.

SUMMARY OF THE INVENTION

The present invention is directed to solve at least the problems and/or disadvantages of the conventional FRAM.

An object of the present invention is to provide a nonvolatile ferroelectric memory device without any separated cell plate lines.

To achieve an object of the present invention, the nonvolatile ferroelectric memory device according to the present invention includes a plurality of bitlines and a plurality of bitbarlines formed in a direction, a plurality of split wordlines which consist of a pair of a first split wordline and a second split wordline that are formed in the direction of intersecting with said bit and bitbarlines, a plurality of memory cells between said first and second split wordlines, and a timing controller for controlling the data input and output timing of the memory cells according to the changes of the X, Y, Z addresses applied from an external and the chip enable signals.

In a local control signal generator included in the memory device according to the present invention, when the memory device is in a write mode under the condition that the chip enable signal is in an enabled state and at the time that either Y address or X, Z address is in transition either a signal Y-ATD or a signal X, Z-ATD corresponding to said address in transition goes up to a high state, a logic value 1 is written into the corresponding memory cell in the interval that the signal applied to the first split wordline SWL1 has a state different from the signal applied to the second split wordline SWL2 and a logic value 0 is written into the corresponding memory cell in the interval that both signals applied to the first and second split wordlines SWL1 and SWL2 are in a high state.

If the memory device goes to a read mode, by making the first and second split wordlines SWL1 and SWL2 hold their disabled states when only one of the signal Y address and the signal X, Z address changes its state according to the transition of said write enable signal to a high state and the corresponding one of the signals Y-ADD and X, Z-ADD goes up to a high state, the read mode transferring the date latched in the sense amplifier to a data bus begins at the beginning that one of the Y address and X, Z address is changed.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
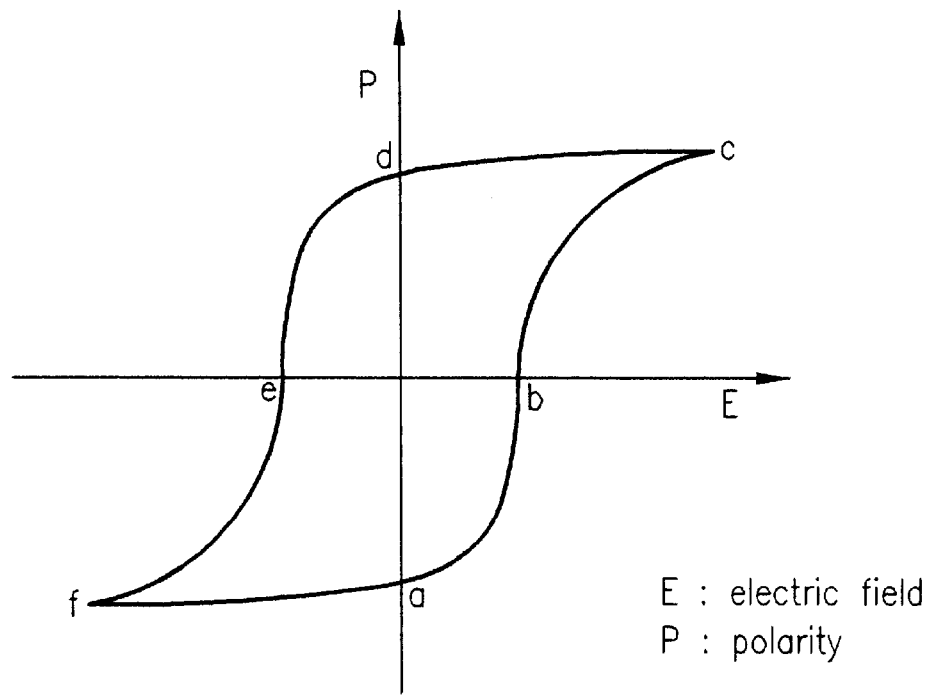
FIG. 1A is a characteristic curve showing a hysteresis loop of a general ferroelectric substance.
Figure 1B:
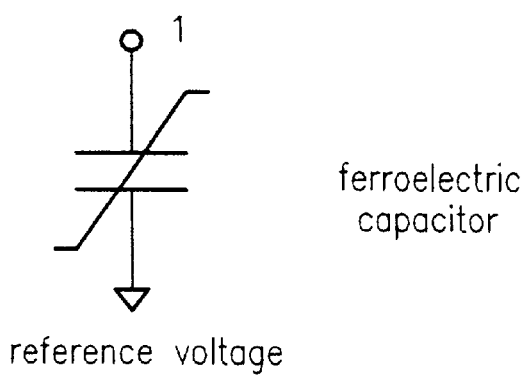
FIG. 1B is a structure of a unit capacitor in a general ferroelectric memory.
Figure 2:
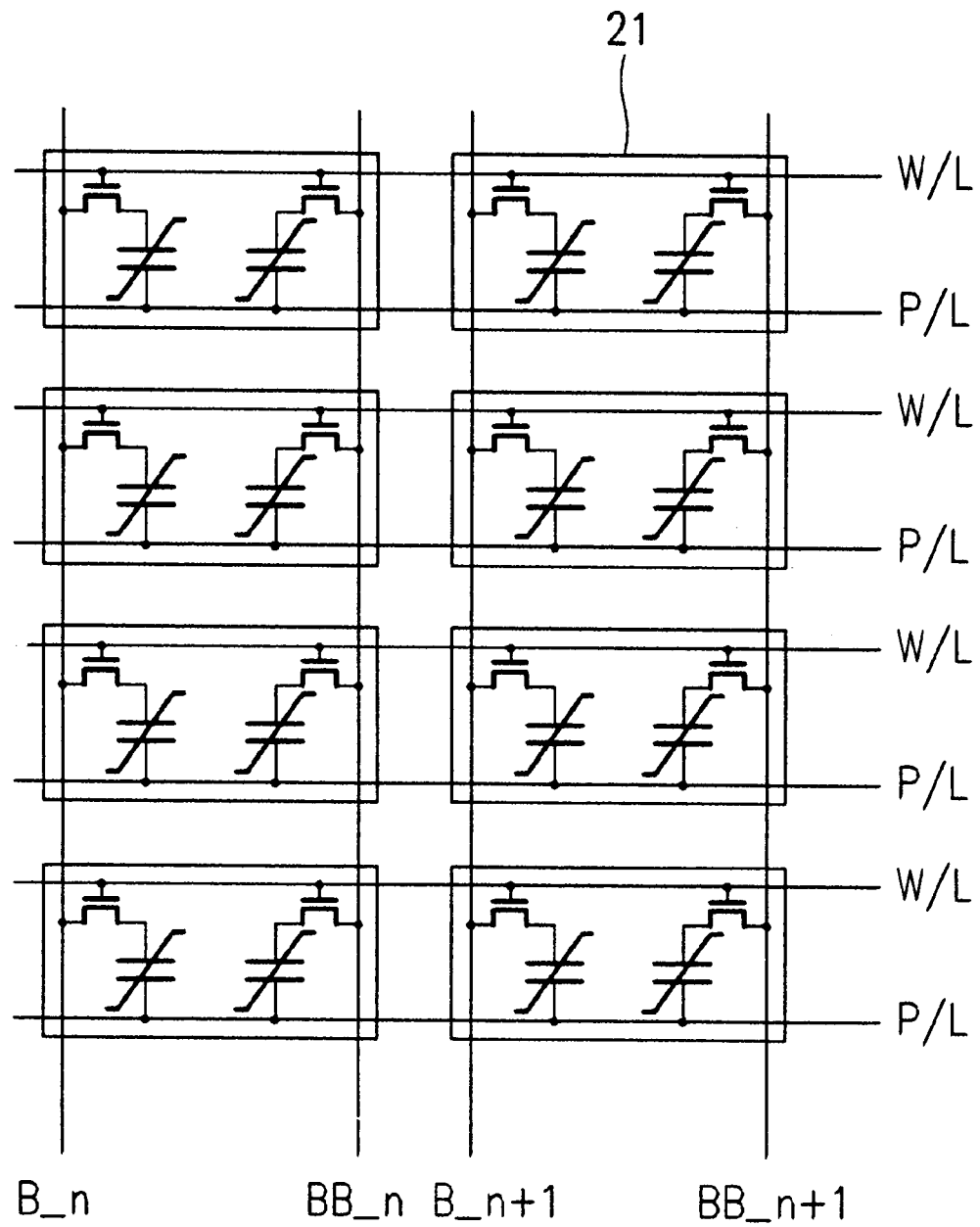
FIG. 2 is of a conventional 2T/2C ferroelectric memory cell array structure.
Figure 3A:
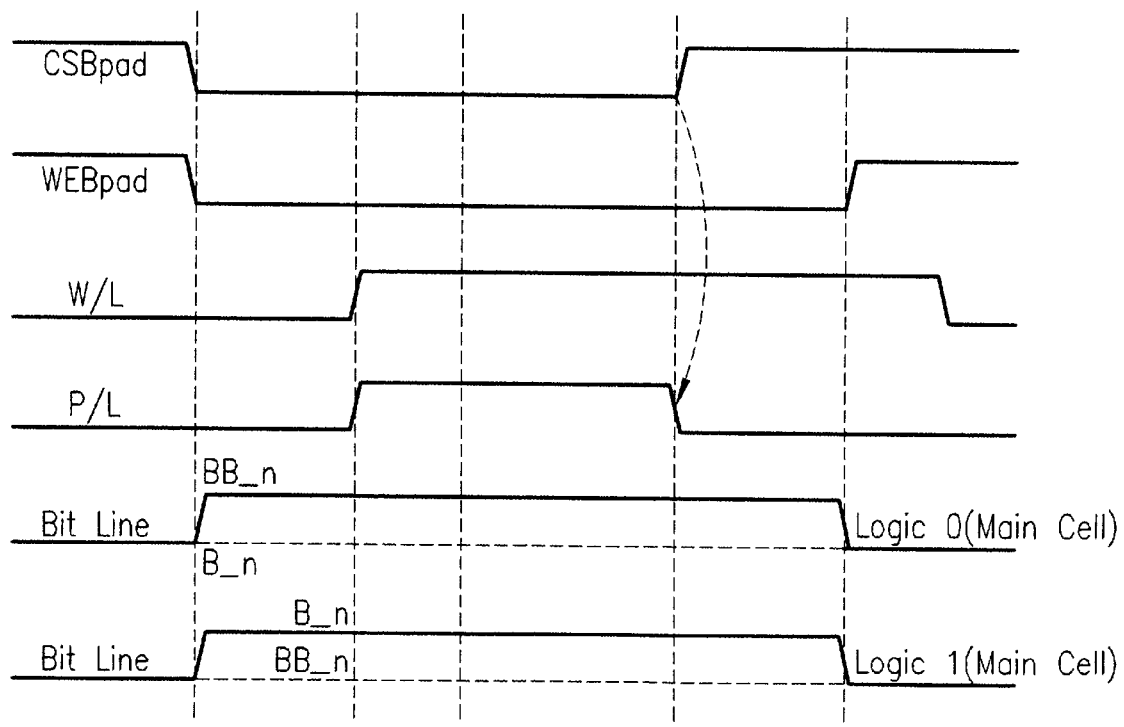
FIG. 3A shows the timing waveforms for a write operation of a conventional 2T/2C ferroelectric memory cell.
Figure 3B:
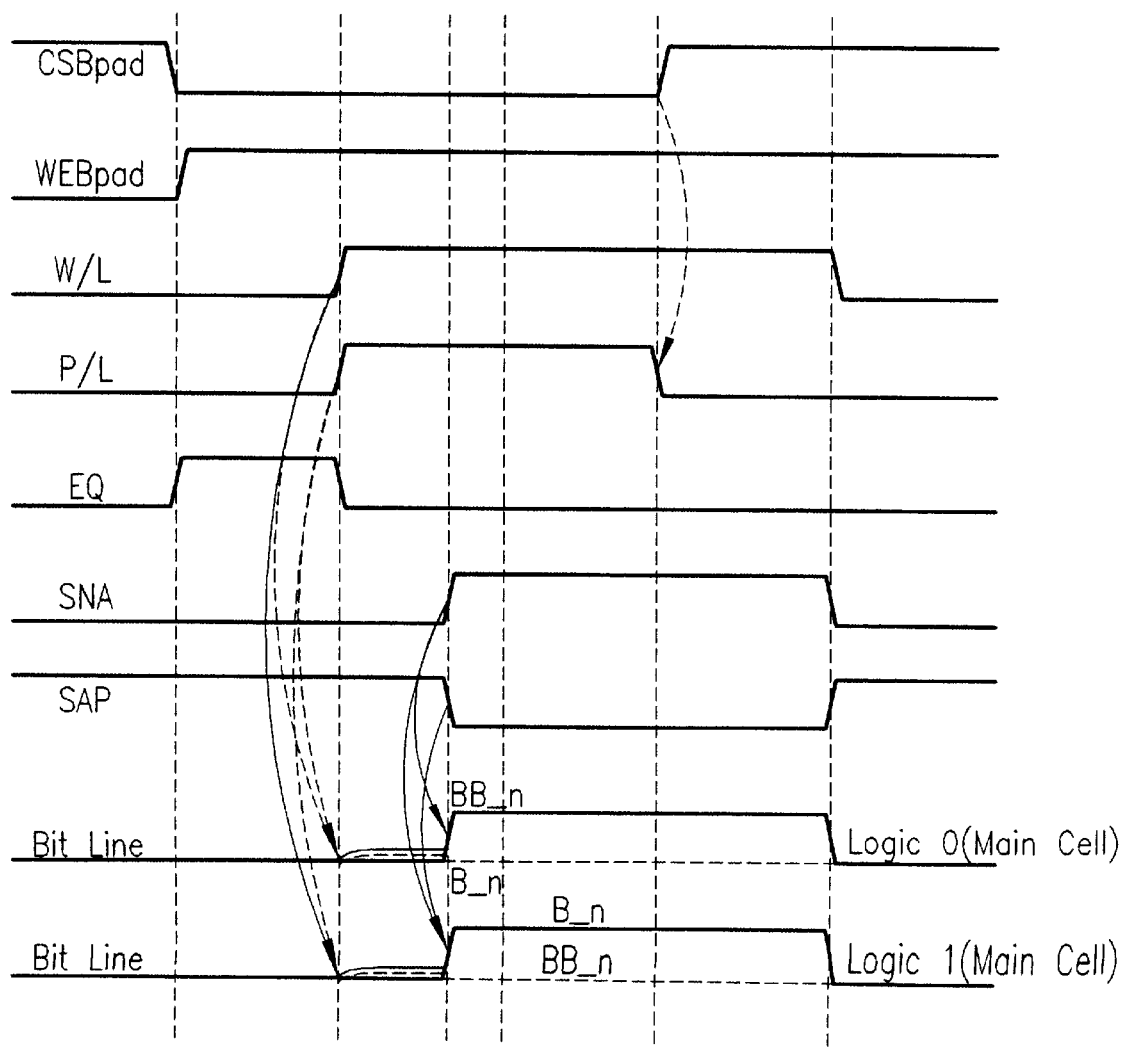
FIG. 3B shows the timing waveforms for a read operation of a conventional 2T/2C ferroelectric memory cell.
Figure 4:
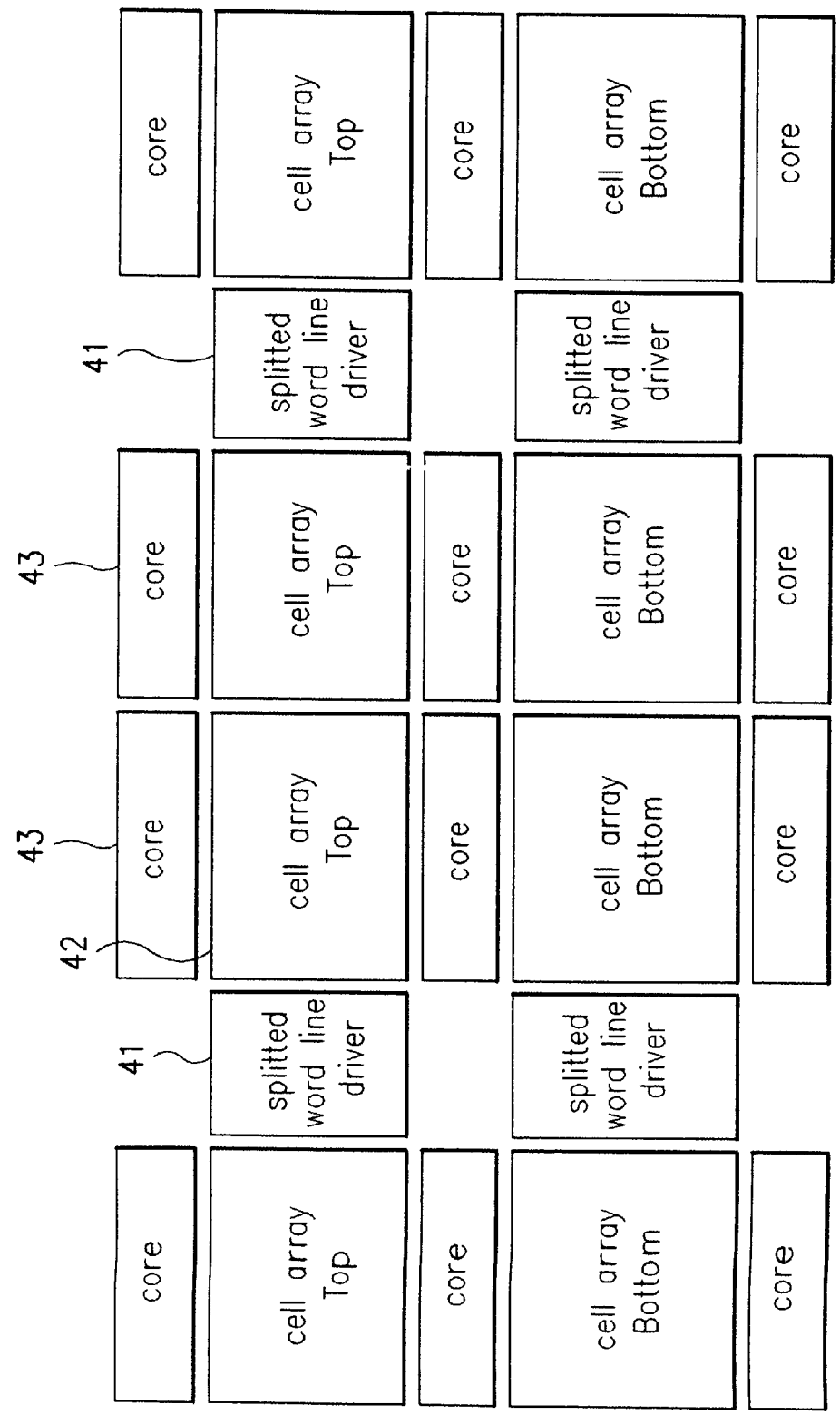
FIG. 4 is a block diagram for a structure of a split wordline driver and a cell array of the nonvolatile ferroelectric memory device according to a preferred embodiment of the present invention.

FIG. 4 is a block diagram for the structure of the nonvolatile ferroelectric memory device according to a preferred embodiment of the present invention. The basic structure of the nonvolatile ferroelectric memory device according to the present invention is classified by three blocks, which comprise a split wordline driver 41 for driving the split wordlines, a cell array 42 for storing data, and a core or input/output circuit 43 including a sense amplifier for sensing data and a bitline controller for controlling the bitlines.

The cell array 42 is provided on each of the right and left sides of a split wordline driver 41, respectively. The core 43 is arranged between the cell arrays 42 on the top and bottom sides of the cell array 42. A number of sense amplifiers in the core is the same as that of the corresponding bit and bitbarlines, each of the sense amplifiers connected to each of the bit and bitbarlines.

Figure 5A:
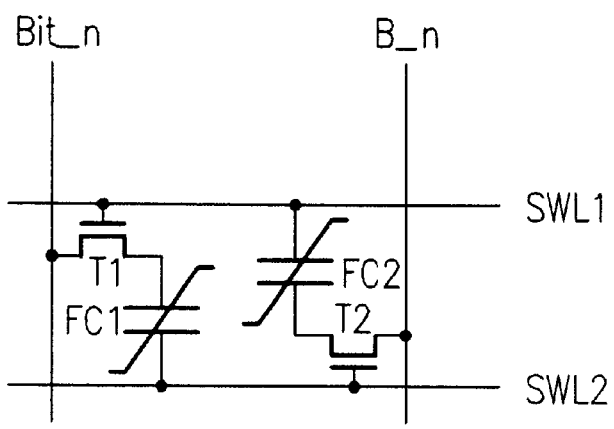
FIG. 5A is a unit cell structure of the nonvolatile ferroelectric memory device according to a preferred embodiment of the present invention.
Figure 5B:
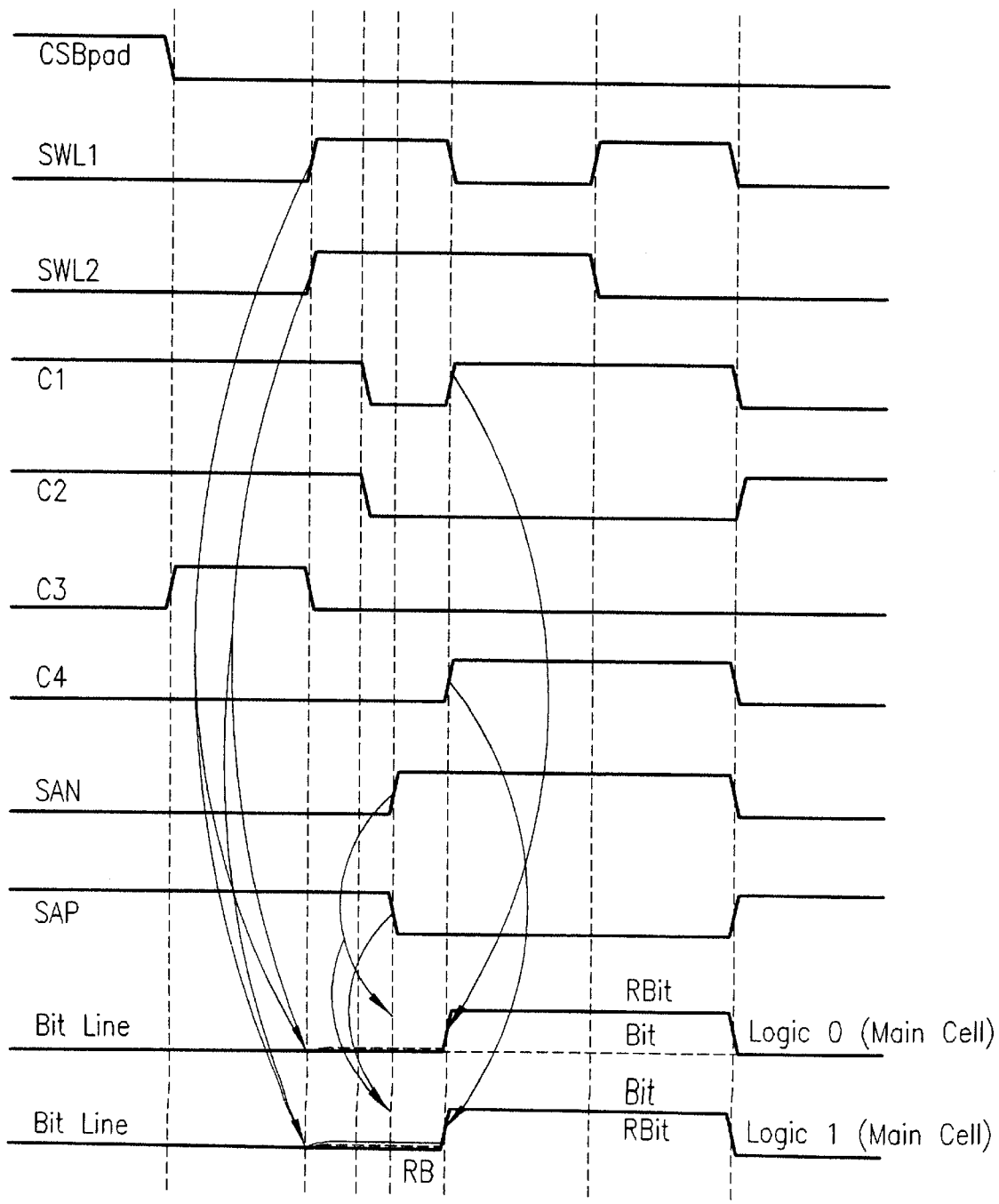
FIG. 5B is an operation waveform diagram of the unit cell of FIG. 5A.

FIG. 5A illustrates a unit cell of each cell array 42 in a nonvolatile ferroelectric memory chip in accordance with a preferred embodiment of the present invention, and FIG. 5B illustrates a waveform diagram of the unit cell in either read or write operation. The unit cell includes a first transistor T1 of, e.g., NMOS, having a gate connected to a first split wordline SWL1, a second transistor T2 of e.g., NMOS, having a gate connected to a second split wordline SWL2. A first ferroelectric capacitor FC1 has a first electrode connected to the SWL2 and a second electrode connected to a source of the first transistor T1, and a second ferroelectric capacitor FC1 has a first electrode connected to the SWL1 and the second electrode connected to a source of the second transistor 93. A drain of the first transistor T1 is connected to the bitline B_n, and a drain of the second transistor T2 is connected to the bitbarline BB_n.

Referring to FIGS. 5A and 5B, the read and write operations can be performed in a similar fashion using the waveforms of the SWL1 and SWL2. If it is in a write mode, a logic "0" can be stored in the first ferroelectric capacitor FC1 and the second ferroelectric capacitor FC2 in an interval where both of the SWL1 and the SWL2 are high. If it is in a read mode, data stored in the first and second ferroelectric capacitors are loaded on the bitline B_n and the bitbarline BB_n.

If the first ferroelectric capacitor FC1 stores a logic "0" and the second ferroelectric capacitor FC2 stores a logic "1", a voltage loaded on the bitline B_n has a voltage rise lower than a voltage loaded on the bitbarline BB_n. This is because the logic "1" stored in the second ferroelectric capacitor FC2 causes to load a more residual polarization charge on the bitbarline BB_n as the logic "1" is turned to a logic "0", resulting in a greater voltage rise. The polarization destruction from logic "1" to logic "0" in the second ferroelectric capacitor should be restored. Opposite to this, if the first ferroelectric capacitor FC1 stores a logic "1" and the second ferroelectric capacitor FC2 stores a logic "0", in a case when the first, and second split wordlines SWL1 and SWL2 transit to a "high" level, the first ferroelectric capacitor FC1 is turned from logic "1" to a logic "0", which is a destruction of data stored therein.

In such an instance, in order to restore the destroyed data in the first and second ferroelectric capacitors, the following pulse is required. In the case when the first ferroelectric capacitor stored a logic "1" and the second ferroelectric capacitor stored a logic "0", the level "high" is applied to the first split wordline, and a level "low" is applied to the second split wordline to restore a logic "1" after a destructive read operation. In other words, a logic "1" may be restored in the first ferroelectric capacitor FC1 when a high data on the bitline B_n is permitted to be applied to the second electrode of the first ferroelectric capacitor FC1 through the NMOS transistor T1 turned on by the SWL1 and a low voltage applied to the first electrode thereof on an opposite side serves as a reference electrode through the SWL2.

In the case when the first ferroelectric capacitor FC1 stored a logic "0" and the second ferroelectric capacitor FC2 stored a logic "1", a low voltage is applied to the first split wordline SWL1, and a high voltage is applied to the second split wordline SWL2 to restore a logic "1" after a destructive read operation. In other words, a logic "1" may be restored in the second ferroelectric capacitor FC2 when a high data on the bitbarline BB_n is permitted to be applied to second electrode of the second ferroelectric capacitor FC2 through the transistor T2 turned on by the SWL2 and a low voltage is applied to the first electrode thereof on an opposite side serving as a reference electrode through the SWL1.

The aforementioned read mode operation is applicable to a write mode operation in a similar fashion. In order to store a logic "1" in the first ferroelectric capacitor FC1 again, the first split wordline SWL1 should be applied of a high signal and the second split wordline should be applied of a low signal. And, in order to store a logic "1" in the second ferroelectric capacitor FC2 again, the first split wordline SWL1 should be applied of a low signal and the second split wordline should be applied of a high signal.

Figure 6:
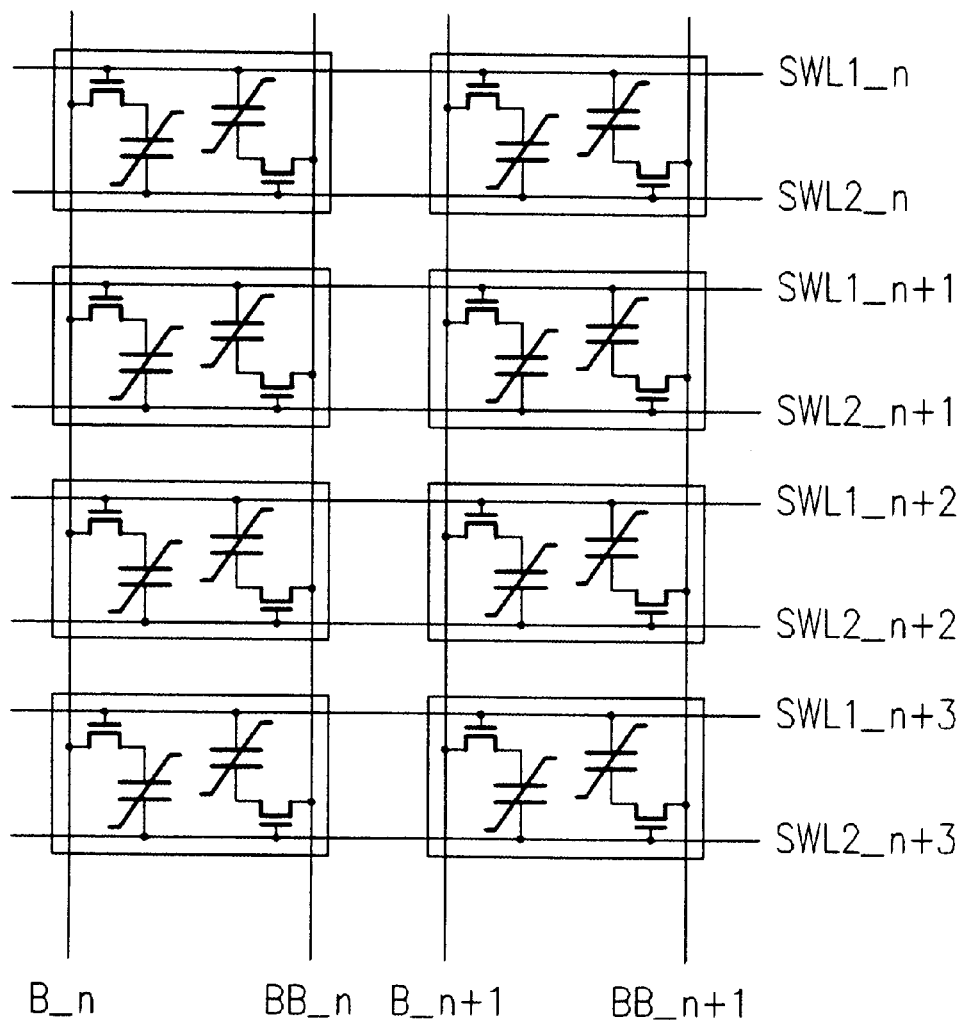
FIG. 6 is a cell array structure of the nonvolatile ferroelectric memory device according to a preferred embodiment of the present invention.

FIG. 6 illustrates a system of memory cell array of a nonvolatile ferroelectric memory in accordance with the present invention. The cell array includes a plurality of first split wordlines SWL1 _n, SWL1_n+1, SWL1_n+2, SWL1_n+3, etc., a plurality of second split wordlines SWL2_n, SWL2_n+1, SWL2_n+2, SWL2_n+3, etc., on one side of the split wordlines, a plurality of bitlines B_n, B_n+1, etc., and a plurality of bitbarlines BB_n, BB_n+1, etc, crossing the first, and second split wordlines, and the memory cells formed at intersections of the first and second split wordlines, and odd and even numbered bitlines, respectively, of the plurality of bitlines.

The memory cells can be formed of a folded bitline system in which the memory cell is provided, not at every crossing of the first and second split wordlines with the bitlines, but in view of a particular split wordline, one for every second bitline. Accordingly, the split wordlines are disposed to have a memory cell at every odd or even numbered bitline, which implies that one split wordline alone can not be enabled, but a pair of first and second split wordlines SWL1 and SWL2 should be enabled simultaneously.

Figure 7:
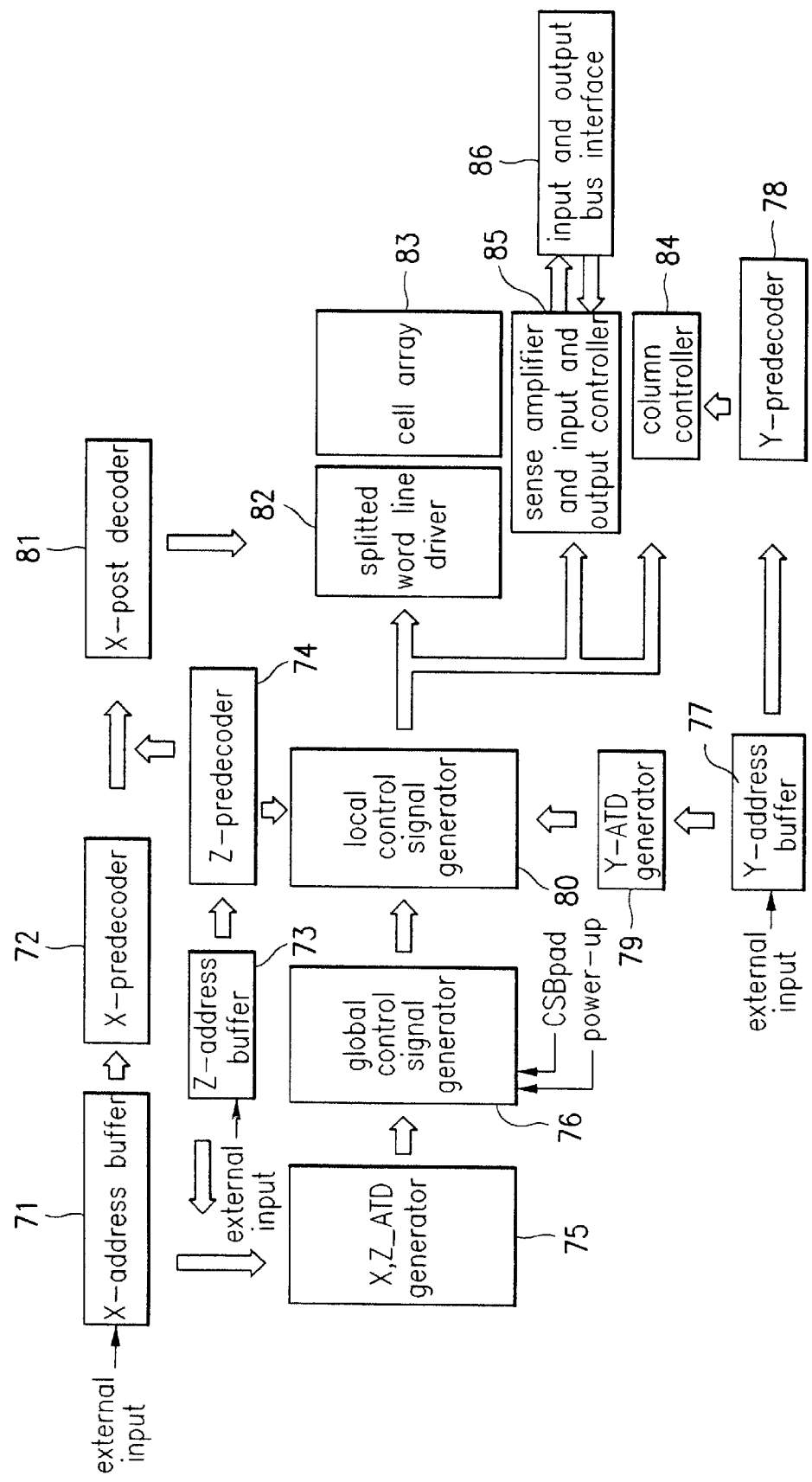
FIG. 7 is a block diagram for a driving circuit of the nonvolatile ferroelectric memory device according to a preferred embodiment of the present invention.

As shown in FIG. 7, an input/output circuit 43 for driving a nonvolatile ferroelectric memory in accordance with a preferred embodiment of the present invention includes an X-buffer 71 for buffering an X address of X-, Y- and Z-addresses, and an X-predecoder 72 for predecoding a signal from the X-buffer 71. A Z-buffer 73 buffers a Z address of X-, Y- and Z-addresses, a Z-pre-decoder 74 for predecoding a signal from the Z-buffer 73. An X, Z-ATD generator 75 detects address transition points of the X-address and Z-address signals from the X-buffer 71 and the Z-buffer 73. A global control pulse generator 76 receives a signal from the X, Z-ATD generator 75 and an external CSB-pad signal for generating a power-up detection signal for itself to provide a basic pulse for memory control according to the X, Z-ATD signal, the CSBpad signal and the power-up detection signal. A Y-buffer 77 buffers a Y address of X-, Y- and Z-addresses received externally. A Y-pre-decoder 78 pre-decodes a signal from the Y-buffer 77, and a Y-ATD generator 79 detects an address transition point of the Y-address signal from the Y-buffer 77.

A local control pulse generator 80 combines a signal from the global control pulse generator 76, a Z address predecoded signal from the Z-pre-decoder 74 and a signal from the Y-ATD generator 79 into a pulse required in each memory block. An X-post decoder 81 combines the X address pre-decoded signal and the Z address pre-decoded signal from the X-pre-decoder 72 and the Z-pre-decoder 74, respectively, to select a cell block. An SWL driver 82 combines the signals from the X-post decoder 81 and the local control pulse generator 80 to apply a driving signal to split wordlines on each of cell blocks 83. A column controller 84 combines the signals from the Y-pre-decoder 78 and the local control pulse generator 80 to select a bitline. A sense amplifier and I/O controller 85 combines a signal from the local control pulse generator 80 and a signal from the column controller 84 to control operation of the sense amplifier and input/output controller 85. An I/O bus controller 86 interfaces the sense amplifier and the I/O controller 85 to an external data.

Figure 8:
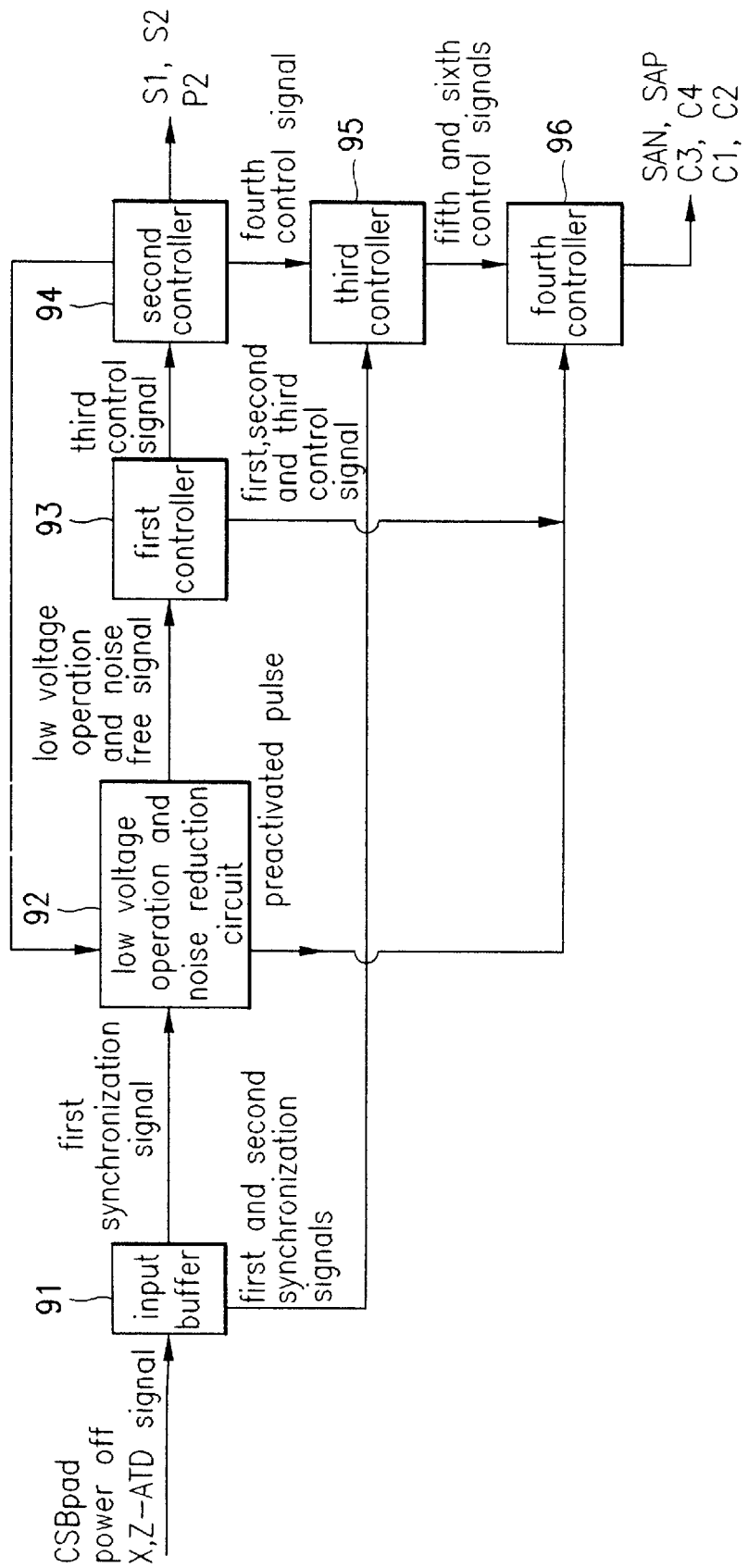
FIG. 8 is a block diagram of a global control signal generator according to a preferred embodiment of the present invention.

FIG. 8 illustrates a system block diagram of a global control pulse generator of FIG. 7. An input buffer 91 receives a signal containing at least CSBpad signal, the X, Z-ATD signal and the power-up detection signal and provides first and second synchronizing signals. A low voltage operation and noise reduction circuit 92 provides: (1) a low voltage detection signal for stopping the operation at a low voltage, (2) a noise canceling signal for filtering a noise in the first synchronizing signal, and (3) a pre-activating pulse for precharging the bitlines and the like in response to the first synchronizing signal from the input buffer 91 and a feed back signal.

When a normal power supply voltage is supplied from the low voltage operation and noise reduction circuit 92, a first controller receives a signal having the noise removed therefrom and provides (1) a first control signal for controlling an enable time point of the sense amplifier, (2) a second control signal for controlling a column selection enable time point and a bitline and bitbarline pull-up, and (3) a third control signal for providing a signal for the SWL driver and other control signals.

A second controller 94 receives the third control signal from the first controller 93 and generates (1) preliminary signals S1 and S2 for generating signals to be applied to a pair of first and second split wordlines SWL1 and SWL2 in the SWL driver, (2) a fourth control signal which is a basic pulse signal for controlling enabled time periods of the signals S1 and S2 and (3) a pulse signal P2 having a driving capability improved from the fourth control signal. The second controller 94 provides the fourth control signal to the low voltage operation and noise reduction circuit 92 as a feed back signal, and the pulse signal P2 to the local control pulse generator 80.

A third controller 95 receives the first and second synchronizing signals from the input buffer 91 and the fourth control signal from the second controller 94 and provides (1) a fifth control signal for controlling the synchronization to the CSBpad signal if all signal except the preliminary signals S1 and S2 are disabled and (2) a sixth control signal for interrupting a disabled state of the CSBpad signal if the CSBpad signal is disabled under a state that the preliminary signal S1 and the preliminary signal S2 are enabled. The third controller 95 sustains the enabled state until the completion of normal operations of the preliminary signals S1 and S2.

A fourth controller 96 is coupled for receiving the fifth and sixth control signals from the third controller 95, the first, second and third control signals from the first controller 93 and the pre-activating pulse from the low voltage operation and noise reduction circuit 92. The fourth controller 96 provides (1) preliminary signals SAN and SAP for generating enable signals for, respectively, NMOS and PMOS elements, of the sense amplifier, (2) a control signal C3 for controlling low voltage pre-charges between a bitline and a bitbarline on a main cell and I/O terminals on the sense amplifier, and (3) a control signal C4 for controlling a pull-up at a column selection enable time point.

In the meantime, if the externally applied signals (the CSBpad signal, the X, Z-ATD signal and the power-up detection signal) to the global control pulse generator are stable, the low voltage operation and noise reduction circuit may be dispensed. The global control signal generator provides a preliminary signal C3 for providing a control signal C3_C to be applied to the sense amplifier and I/O controller 25, preliminary signals S1 and S2 for providing control signals PS1 and PS2 to be applied to the split wordline drivers 22, a preliminary signal for providing a control signal C4N to be applied to the column controller 24, and preliminary signals C1 and C2 for controlling connection between bitlines and the I/O terminal on the sense amplifier to the local control signal generator 20.

Figure 9:
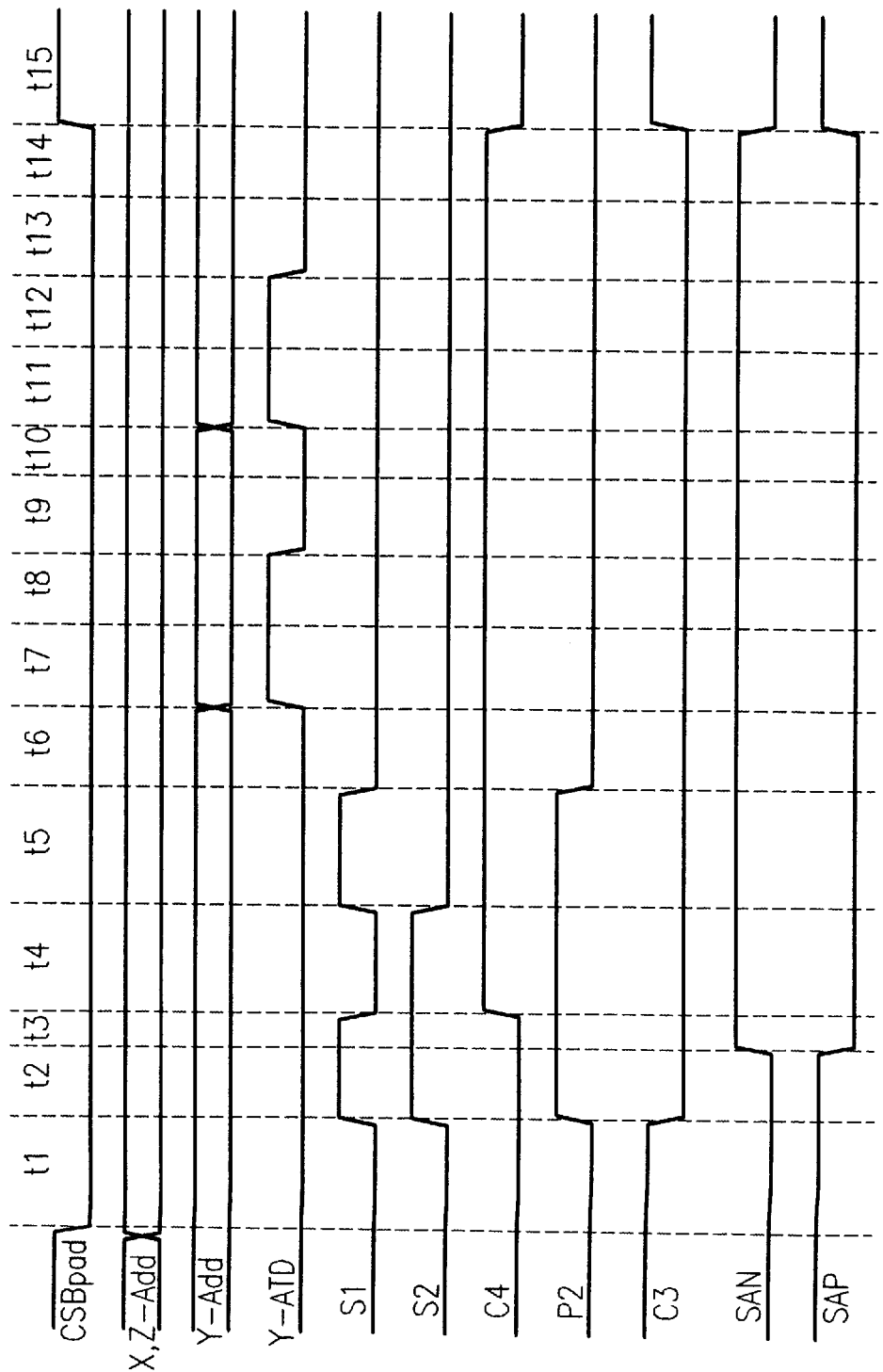
FIG. 9 is input and output waveforms of the global control signal generator when Y address changes according to the structure of FIG. 8.

FIG. 9 is a operation timing chart for the input and output operations of the global control signal generator when the Y address changes. The chip enable signal CSBpad is externally provided through a chip enable pin and since the signal CSBpad has a low state as its enabled state, the signal CSBpad is enabled by the transition from a high state to a low state. A disabled interval of a high state is necessary for performing a new read or a new write operation.

The signal S1 is an output signal of the global control signal generator 76 to be applied to the local control signal generator 80 for generating a signal for the SWL1 described beforehand. The signal S2 is an output signal of the global control signal generator 76 to be applied to the local control signal generator 80 for generating a signal for the SWL2. In the split wordline driver 82, the three signals of a row address decoder, PS1 and PS2 are combined and generates the drive signals for the split wordlines SWL1 and SWL2.

The waveforms in FIG. 9 are the input and output signals and the whole period is divided into 15 intervals from t1 to t15. It is assumed that the signal CSBpad is enabled in a low state from the interval t1 to the end of the interval t14 and transits to a high state at the starting point of the interval t15 and thereafter is disabled.

First, in the interval t1, the signal CSBpad is enabled from a high state to a low state. At this time, X, Y and Z addresses hold the same states as those before the interval t1, respectively. After Y address transits at the starting point of the interval t7, the signal Y-ATD holds a high state in the intervals t7 and t8. In other words, since the change of Y address is detected at the starting points of the intervals t7 and t11, respectively, the signal Y-ATD holds a high state in the intervals t7, t8, t11 and t12.

When the interval t1 is passed and the interval t2 begins, the signals S1 and S2 transits to a high state. After then, the signal S1 holds the high state in the interval t3 and a low state in the interval t4. The signal S2 holds the high state in the intervals t3 and t4.

The signals S1 and S2 are used to form the basic waveforms for the split wordlines SWL1 and SWL2. The signal C4 (a preparatory signal of the signal C4N to be combined with Y address predecoded in the column control) goes from a previous low state to a high state at the beginning of the interval t4 and again goes down to a low state at the beginning that the signal CSBpad is disabled (before the interval t5 begins). The signal C4 controls the pull up of each of the bitline and the bitbarline of the main cell and controls the signal flow between the bitline and the output of the sense amplifier. Therefore, a signal transmission between the bitline of the main cell and the data line is possible in the intervals from t4 to t14.

The signal P2 (a preparatory signal for controlling the signals PS1 and PS2 to be applied to the split wordlines) goes to a high state at the beginning of the interval t2 when the signals S1 and S2 go to a high state and again goes to a low state at the beginning of the interval t6. In other words, the signal P2 holds a high state in the intervals from t2 to t5 when the signals S1 and S2 are in their normal operations and prevents the normal operations of the signals S1 and S2 from disturbance in those intervals.

The signal C3 (a preparatory signal of the signal C3_C for equalizing the input and output node of the sense amplifier) holds its previous high state by the end of the interval t1 and goes to a low state at the beginning of the interval t2. The signal C3 again goes up to a high state at the beginning when the signal CSBpad is disabled at the interval t15.

The signal SAN (a preparatory signal for generating a signal SAN_C to control NMOS transistor so as to drive the sense amplifier in the sense amplifier input and output controller 85) holds its previous low state by the end of the interval t2, goes up to a high state at the beginning of the interval t3 and then goes down to a low state at the time that the signal CSBpad is disabled at the interval t15.

The signal SAP (a preparatory signal for generating a signal SAP_C to control PMOS transistor so as to drive the sense amplifier in the sense amplifier input and output controller 85) gets a transition opposite to said signal SAN. In other words, the signal SAP holds its previous high state by the end of the interval t2 and goes down to a low state at the beginning of the interval t3 and again goes up to a high state at the time that the signal CSBpad is disabled at the interval t15.

Figure 10:
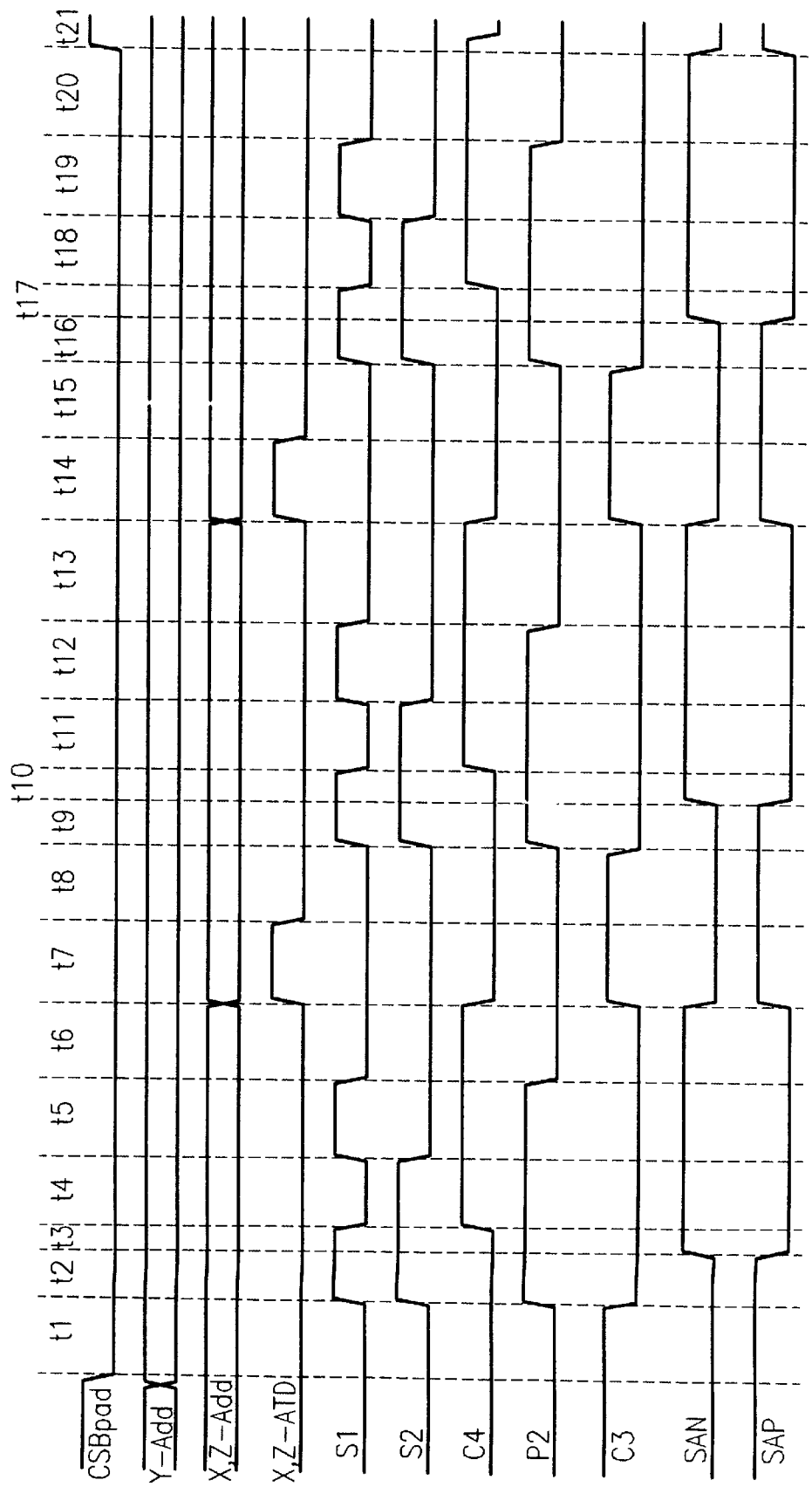
FIG. 10 is input and output waveforms of the global control signal generator when X, Z addresses are changed according to the structure of FIG. 8.

FIG. 10 shows the input and output waveforms of the global control signal generator when X, Z addresses are changed according to the structure of FIG. 8. The waveforms in FIG. 10 for the X, Z address change are very similar to the waveforms in FIG. 9 for the Y address change, but the differences between the two figures are as follows.

While the signal Y-ATD goes up to a high state in the intervals t7 and t11 that the Y address is changed in FIG. 9, the signal X, Z addresses go up to a high state in the intervals t7 and t11 that the X, Z address is changed in FIG. 10. The signal C4 holds a low state by the end of the interval t3, goes up to a high state at the beginning of the interval t4, holds the high state by the time that the signal X, Z-ATD goes up to a high state, and again goes down to a low state at the beginning of the interval t7. Thus, when the signal X, Z address is changed, the signal X, Z-ATD and the signal CSBpad are applied to the input of the global control signal generator.

As described above, if there are any intervals that the signal X, Z- ATD is in a high state, t7 and t11 for this case, the global control signal generator 76 uses the intervals as the signal CSBpad is in a high state. Therefore, the global control signal generator 76 generates all control signals and the corresponding X, Z addresses can be accessed in a normal manner.

Figure 11:
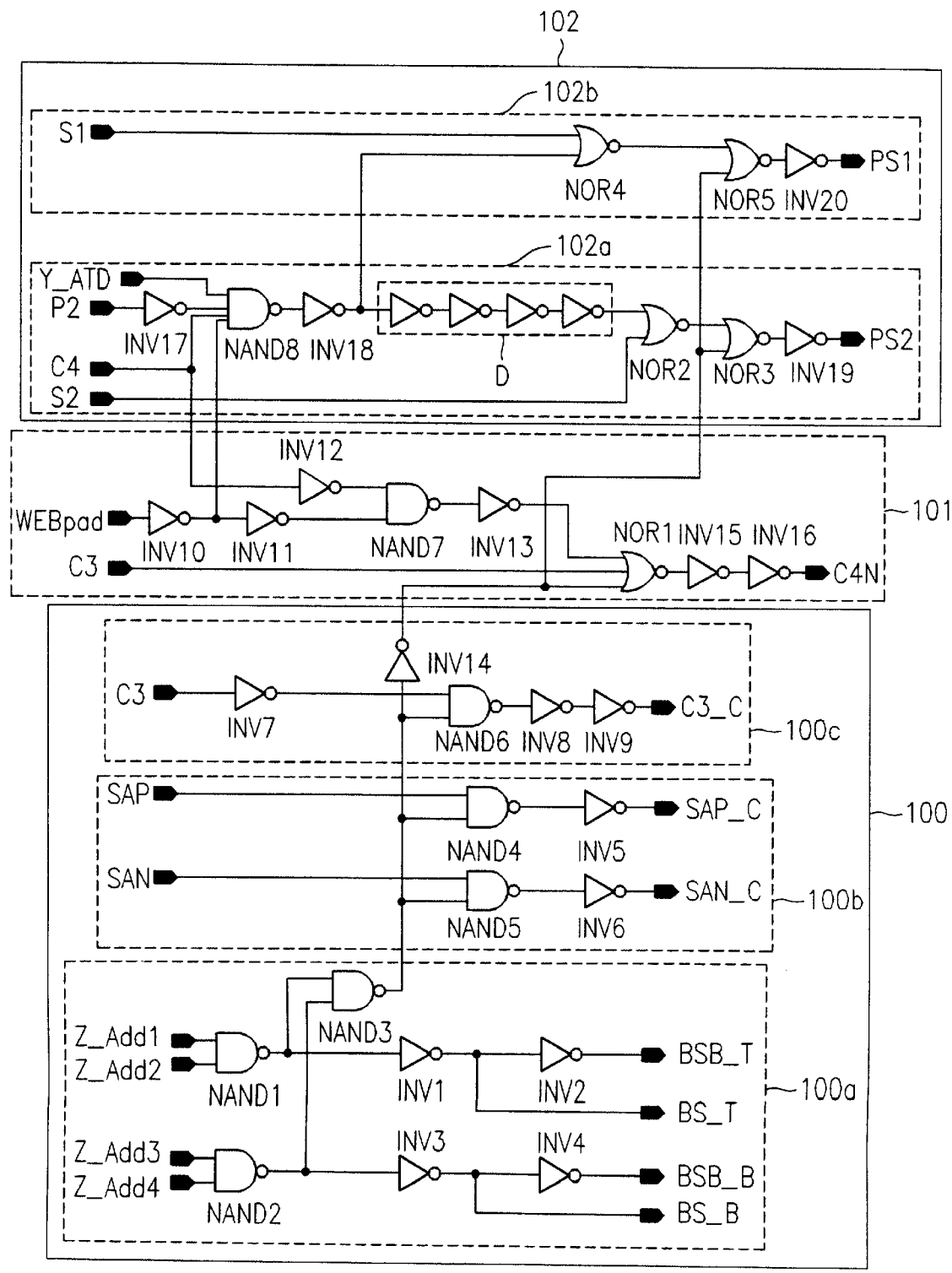
FIG. 11 is a structure of a local control signal generator according to a preferred embodiment of the present invention.

FIG. 11 illustrates a detailed structure of a local control signal generator of the nonvolatile ferroelectric memory device in accordance with a preferred embodiment of the present invention. The local control signal generator 80 receives the output signals of the global control signal generator 76, the signal Y-ATD and the output signal of the Z predecoder 74. Thereafter, the local control signal generator 80 generates the control signals for the split wordline driver 82, the sense amplifier and input and output controller 85 and the column controller 84.

The signals S1, S2, P2, C3, C4, SAN and SAP are the output signals of the global control signal generator 76. The signal Y-ATD is the address transition detection signal generated by the Y address transition. The signal WEBpad is the signal for a write enable pad and is enabled in a low state for the write mode.

The local control signal generator of the present invention includes first, second and third logic circuit units 100, 101 and 102. The first logic circuit unit generates the signals applied to the sense amplifier and input and output controller 86. The second logic circuit unit 101 generates the signals applied to the column controller 84, and a third logic circuit unit 102 generates the signals applied to the split wordline driver 82.

The first logic circuit unit 100 includes first, second and third logic operation units 100a, 100b and 100c. The first logic operation unit generates signals BS_T, BSB_T for the bit and bitbarlines of the upper memory array, and BS_B and BSB_B for the bit and bitbarlines of the bottom memory array. The second logic operation unit 100b generates signals SAP_C and SAN_C and the third logic operation unit 100c generates a signal C3_C for input/output control circuit 85. The third logic circuit unit 102 includes a fourth logic operation unit 102a for generating signal PS2 and a fifth logic operation unit 102b for generating a signal PS1 for the split wordline driver 82.

The first logic operation unit 100a performs a logic operation on the signals Z-Add1, Z-Add2, Z-Add3 and Z-Add4. A first NAND gate (NAND1) performs a NAND operation of the signals Z-Add1 and Z-Add2, and a second NAND gate (NAND2) performs a NAND operation of the signals Z-Add3 and Z-Add4. A third NAND gate (NAND3) performs a NAND operation on the output signals of the first and second NAND gates. A first inverter (INV1) inverts the output signal of the first NAND gate, a and a second inverter (INV2) inverts the output signal of the first inverter. A third inverter (INV3) inverts the output signal of the second inverter, and a fourth inverter (INV4) inverts the output signal of the third inverter.

The output signal BS_T of the first inverter (INV1) is applied to the sense amplifier and input and output controller 85 and the output signal BSB_T of the second inverter (INV2) is applied to the sense amplifier and input and output controller 85. The signals BS_T and BSB_T, which are the input signals of the sense amplifier and input and output controller 85, are the control signals to control the transmission gates selectively connecting the input and output terminals of the sense amplifier to the bit and bitbarlines of the top main cell block.

The output signals BS_B and BSB_B of the third and fourth inverters are also input signals to the sense amplifier and input and output controller 85. The signals BS_B and BSB_B control two transmission gates connecting the input and output terminals of the sense amplifier to the bit and bitbarlines of the bottom main cell block.

The second logic operation unit 100b also generates an input signal of the sense amplifier and input and output controller 85 by combining the output signal of the third NAND gate (NAND3) and the output signals SAP and SAN of the global control signal generator 76. A fourth NAND gate (NAND4) performs a logic operation on the signal SAP and the output signal of the third NAND gate. A fifth inverter (INV5) inverts the output signal of the fourth NAND gate, and a fifth NAND gate (NAND5) performs a logic operation on the signal SAN and the output signal of the third NAND gate. A sixth inverter (INV6) inverts the output signal of the fifth NAND gate. The output signal of the fifth inverter is used as a signal SAP__C and the output of the sixth inverter is used as a signal SAN__C for the sense amplifier.

The third logic operation unit 100c generates an input signal C3__C of the sense amplifier and input and output controller 85 by combining the output signal of the third NAND gate (NAND3) and the output signal C3 of the global control signal generator 76. A seventh inverter (INV7) inverts the signal C3, and a sixth NAND gate (NAND6) performs a logic operation on the output signal of the third NAND gate and the output signal of the seventh inverter. An eighth inverter (INV8) inverts the output signal of the sixth NAND gate, and a ninth inverter (INV9) inverts the output signal of the eighth inverter. The signal C3__C is used as a control signal to pull down the bit and bitbarlines in the sense amplifier and input and output controller 85. At the same time, the signal C3__C is used to control the pull down for equalization and equalizer, and is commonly used for a plurality of bit and bitbarlines.

The second logic circuit unit 101 generates the signal C4N for the column controller 84 by performing a logic operation on the output signals C3, C4 of the global control signal generator 76, the signal WEBpad and the inverted output signal of the third NAND gate (NAND3). A tenth inverter (INV10) inverts the signal WEBpad, and an eleventh inverter (INV11) inverts the output signal of the tenth inverter. A twelfth inverter (INV12) inverts the signal C4, and a seventh NAND (NAND7) gate performs a logical NAND operation on the output signal of the eleventh inverter and the output signal of the twelfth inverter. A thirteenth inverter (INV13) inverts the output signal of the seventh NAND gate, and a fourteenth inverter (INV14) inverts the output signal of the third NAND gate.

A first NOR gate (NOR1) performs a logical NOR operation on the signal C3, the output signal of the fourteenth inverter and the output signal of the thirteenth inverter. A fifteenth inverter (INV15) inverts the output signal of the first NOR gate, and a sixteenth inverter (INV16) inverts the output signal of the fifteenth inverter. The output signal C4N of the second logic circuit unit 101 is combined with a plurality of predecoded Y addresses generated from the Y predecoder 78.

The third logic circuit unit 102 includes a fourth logic operation unit 102a and a fifth logic operation unit 102b. The fourth logic operation unit 102a generating the input signal PS2 of the split wordline driver 82 includes a seventeenth inverter (INV17) inverting the output signal P2 of the global control signal generator 76. An eighth NAND gate (NAND8) performs a logical NAND operation on the signal Y-ATD, the signal C4 and the output signal of the tenth inverter. An eighteenth inverter (INV18) inverts the output signal of the eighth NAND gate, and a delay unit D delays the output signal of the eighteenth inverter by a fixed time. A second NOR gate (NOR2) performs a logical NOR operation on the signal S2 and the output signal of the delay unit (D). A third NOR gate (NOR3) performs a logic NOR operation on the output signal of the second NOR gate and the output signal of the fourteenth inverter. A nineteenth inverter (INV19) inverts the output signal of the third NOR gate. The delay unit D consists of an even number of inverters.

The fifth logic operation unit 102b generates the input signal PS1 of the split wordline driver 82. A fourth NOR gate (NOR4) performs a logical NOR operation on the output signal S1 of the global control signal generator 76 and the output signal of the eighteenth inverter. A fifth NOR gate (NOR5) performs a logical NOR operation on the output signal of the fourth NOR gate and the output signal of the fourteenth inverter. A twentieth inverter (INV20) inverts the output signal of the fifth NOR gate.

The signals S1, S2, P2, C3, C4, SAN and SAP applied to the local control signal generator 80 are provided by the global control signal generator 76. The signals Z-Add1, Z-Add2, Z-Add3 and Z-Add4 applied to the local control signal generator 80 are obtained from the Z predecoder 74. The signals BS__T and BSB__T applied to the input terminals of the sense amplifier and input and output controller 85 are used for accessing the bit and bitbarlines of the top main cell block. The signals BS__B and BSB__B are used for accessing the bit and bitbarlines of the bottom main cell block.

The operations of the write and read modes of the local control signal generator are explained as follows. In the write mode, since the signal WEBpad is in a low state and therefore the output signal of the eleventh inverter is in a low state, the seventh NAND gate (NAND7) is disabled and its output signal is in a high state. Since the output signal of said high state enables the first NOR gate (NOR1), the signal C3 is changed into a signal C4N after passing through the two inverters INV15 and INV16. While the bit and bitbarlines are precharged before the split wordlines SWL1 and SWL2 are enabled, the signal C3 makes the signal C4N in a low state during application to the column controller 84.

Therefore, when the signal C4N is in a low state, all the column selection signals are disabled and the signal flow between the output data bus and the bitlines is prohibited. As a result, when the bitline precharge is performed in the write mode, a collision between the data of the bitline and the data of the output data bus is avoided.

Since the output signal of the tenth inverter INV10 is in a high state in the write mode, the eighth NAND gate (NAND8) is enabled. Therefore, the eighth NAND gate NAND8 is controlled by the signals Y-ATD, P2 and C4. In other words, when the signal P2 is in a high state and then the signals S1 and S2 are in normal operations in their enabled states, the eighth NAND gate is disabled, and therefore, the signals S1 and S2 are securely in a normal operation.

If the normal operations of the signals S1 and S2 are completed, the signal P2 goes down to a low state and the output signal of the seventeenth inverter INV17 goes up to a high state. Therefore, the eighth NAND gate is enabled and the operation of the eighth NAND gate is determined according to the signals Y-ATD and C4.

If the signal C4 goes up to a high state while the tenth inverter INV10 is in a high state, the eighth NAND gate NAND8 is enabled and the signal Y-ATD is transferred to the split wordline driver 82. In other words, when the signals S1 and S2 enable the second and fourth NOR gates NOR2 and NOR4 in the interval that Y address gets a transition, the signal Y-ATD is transmitted to the fourth NOR gate (NOR4) through the eighth NAND gate NAND8 and the eighteenth inverter INV18. At the same time, the output signal of the delay unit D is transmitted to the second NOR gate NOR2.

When the signal Y-ATD passes through the fourth and fifth NOR gates NOR4 and NOR5 and the twentieth inverter INV20, the signal has an inverted polarity and is transformed into the signal PS1 of a low state. When the signal Y-ATD passes through the second and third NOR gates NOR2 and NOR4 and the nineteenth inverter INV19, the signal has an inverted polarity and is transformed into the signal PS2 of a low state. Therefore, the signals PS1 and PS2 have the inverted polarity compared to the signal Y-ATD. By adjusting a number of inverters forming the delay unit D, the overlapping on the low state of both signals PS1 and PS2 can be controlled.

In the read mode, when the seventh NAND gate (NAND7) is enabled, the signal C4 passes through the twelfth inverter (INV12), the seventh NAND gate (NAND7), the thirteenth inverter (INV13), the first NOR gate (NOR1), the fifteenth inverter (INV15), and the sixteenth inverter (INV16) in sequence and is transformed into the signal C4N having the same waveform. Therefore, the signal C4N transfers the signal amplified by the sense amplifier to the data bus.

Furthermore, in the read mode, since the eighth NAND gate (NAND8) is disabled according to the low output signal of the tenth inverter ((INV10), the signals Y-ATD, P2 and P4 are cut off and the output signal of the eighteenth inverter is a low state, and therefrom, the fourth NOR gate (NOR4) is always enabled. The signals PS1 and PS2 applied to the input ports of the split wordline driver 82 have the opposite waveforms against the signals S1 and S2, respectively.

Figure 12:
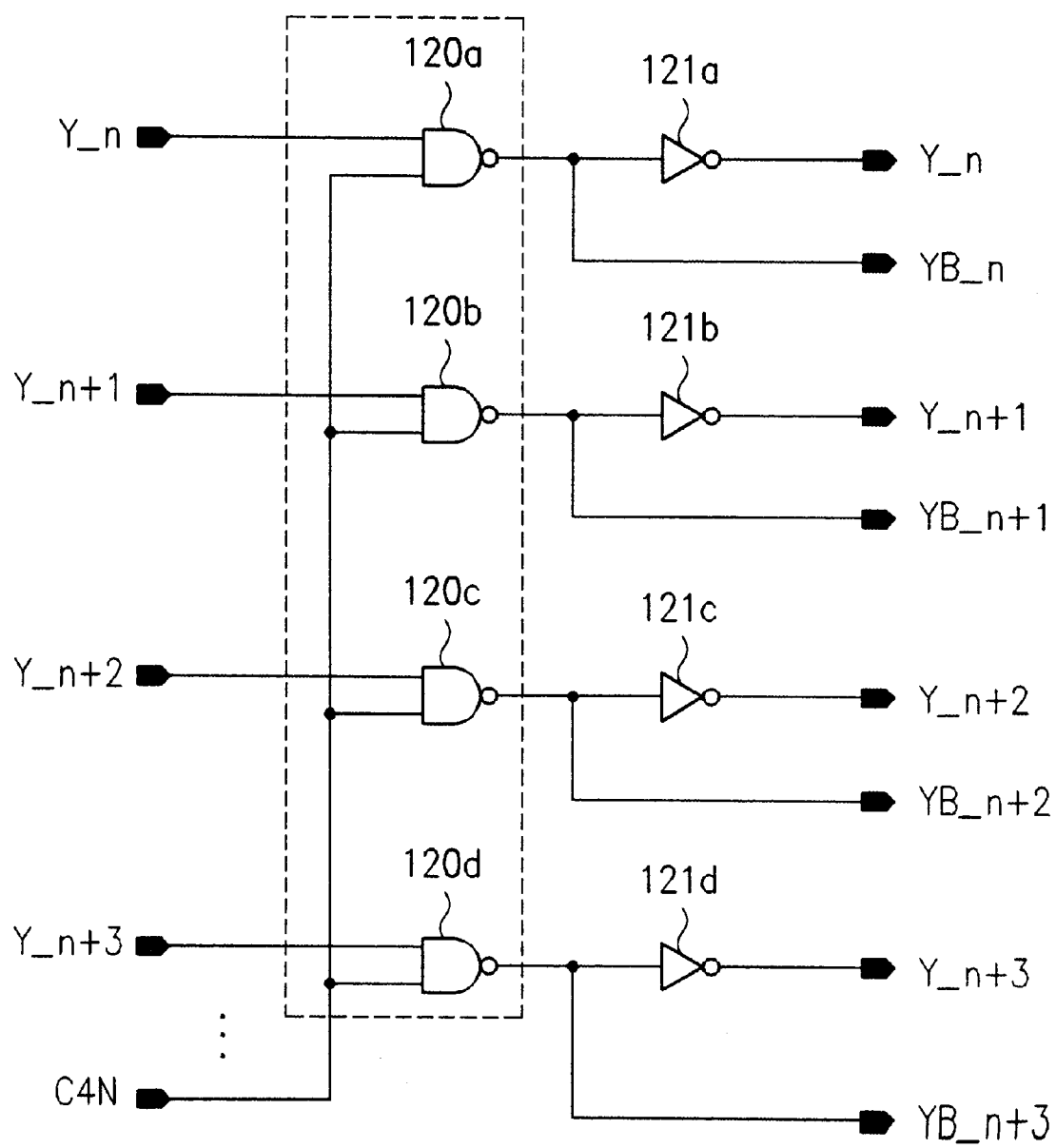
FIG. 12 is structure of a column controller according to a preferred embodiment of the present invention.

FIG. 12 is a detailed block diagram for the column controller according to the present invention in FIG. 7. As shown in FIG. 7, the column controller operates according to the output signal of the Y predecoder 78 and the output signal of the local control signal generator 80.

The column controller includes a plurality of logic gates 120a, 120b, 120c and 120d performing a logic operation on each of a plurality of addresses Y_n, Y_n+1, Y_n+2, Y_n+3, etc. which are predecoded by the Y predecoder 78 and the output signal C4N of the local control signal generator 80. Each of a plurality of inverters 121a, 121b, 121c and 121d is connected to the output terminal of each of the plurality of logic gates 120a, 120b, 120c and 120d.

The output signals of the logic gates 120a, 120b, 120c and 120d form the Y addresses YB_n, YB_n+1, YB_n+2 and YB_n+3 of the bitbarlines. If the output signals of said logic gates 120a, 120b, 120c and 120d pass through the corresponding inverters 121a, 121b, 121c and 121d, respectively, then the output signals of the inverters 121a, 121b, 121c and 121d form the Y addresses Y_n, Y_n+1, Y_n+2 and Y_n+3 of the bit lines.

The column controller 84 generates a plurality of Y addresses for the bit and bitbarlines by combining a plurality of addresses predecoded by the Y predecoder 78 and the output signal C4N of the local control signal generator 80. Some of the Y addresses are applied to the sense amplifier and input and output controller 85.

Figure 13:
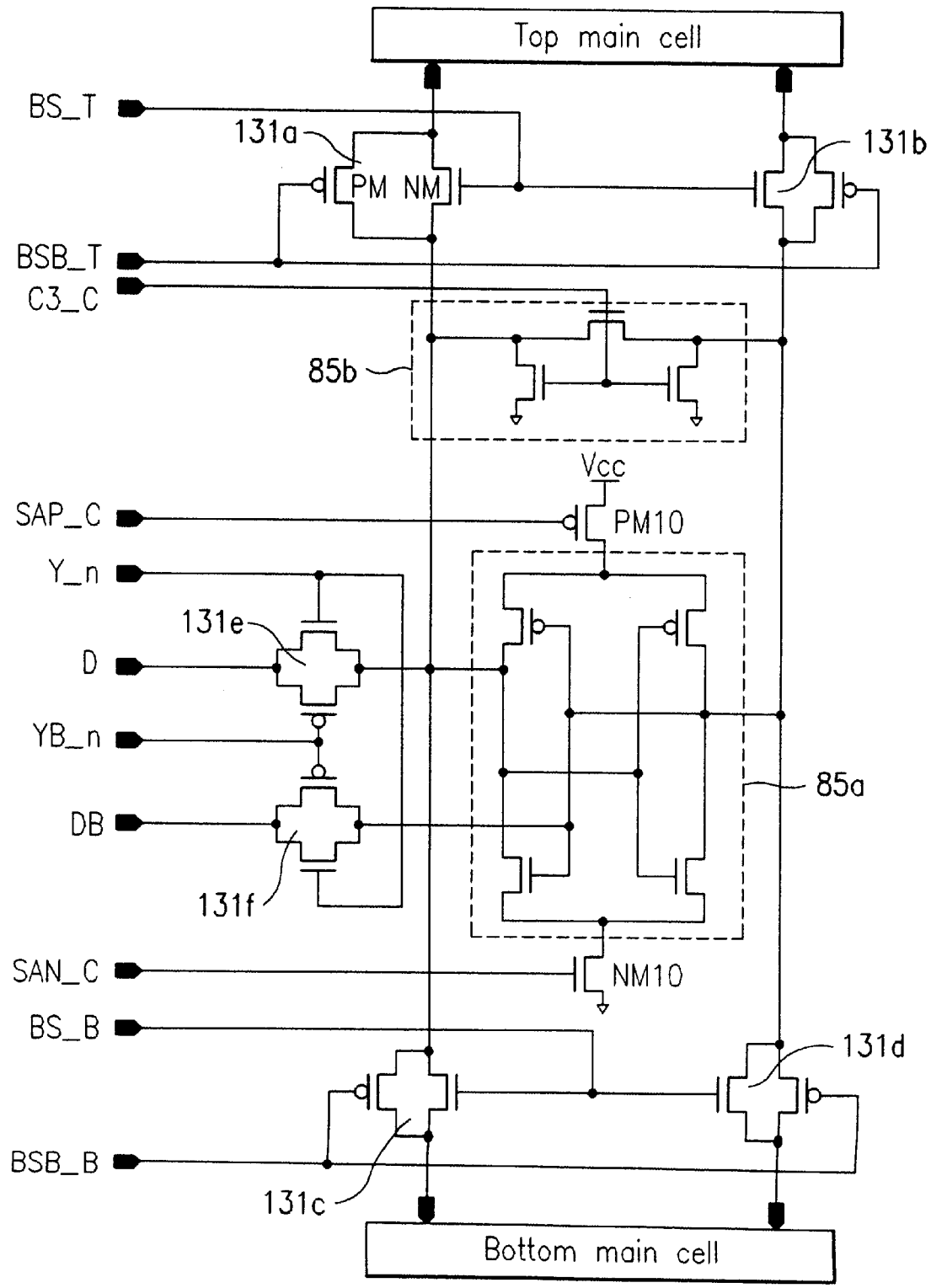
FIG. 13 is a structure of the sense amplifier and input and output control circuit according to a first preferred embodiment of the present invention.

FIG. 13 is the structure of the sense amplifier and input and output control circuit 85 according to a preferred embodiment of the present invention. The signal lines BIT_T and BITB_T correspond to the bitline and bitbarline connected to the top main cell block, and the signal lines BIT_B and BITB_B correspond to the bitline and bitbarline connected to the bottom main cell block, which are formed in the column direction.

A sense amplifier 85a detects the data loaded on the bitline and the bitbarline and amplifies the detected data to transfer the amplified data to the data and data bar lines D and DB. A pull down and equalizer 85b equalizes the potentials of the bitline and the bitbarline by performing a pull down operation. The first and second transmission gates 131a and 131b selectively connect the input and output ports of the sense amplifier and the bit and bitbarlines of the top main cell, and the third and fourth transmission gates 131c and 131d selectively connect the input and output ports of the sense amplifier and the bit and bitbarlines of the bottom main cell.

The fifth and sixth transmission gates 131e and 131f selectively connect the input and output ports of the sense amplifier and the data and data bar lines D and DB. The PMOS transistor PM10 and the NMOS transistor NM10 control the enable or disable state of the sense amplifier 85a. The gate control signals SAP_C and SAN_C, which are provided by the local control signal generator 80 control the PMOS and NMOS transistors and are commonly used by plurality of the bit and bitbarlines.

When the sense amplifier 85a senses the data of the top main cell, the first and second transmission gates 131a and 131b are turned on and the third and fourth transmission gates 131c and 131d are turned off. In contrast, when the sense amplifier 85a senses the data of the bottom main cell, the first and second transmission gates 131a and 131b are turned off and the third and fourth transmission gates 131c and 131d are turned on.

Each of the four transmission gates consists of a pair of PMOS (PM) and NMOS (NM) connected to each other in parallel. The control signals BS_T and BSB_T for controlling the first and second transmission gates and the control signals BS_B and BSB_B for controlling the third and fourth transmission gates are provided from the local control signal generator 80. The Y address and Y address bar signals selectively generated from the column controller 84 are used as the control signals Y_n and YB_n for controlling the fifth and sixth transmission gates 131e and 131f.

Figure 14:
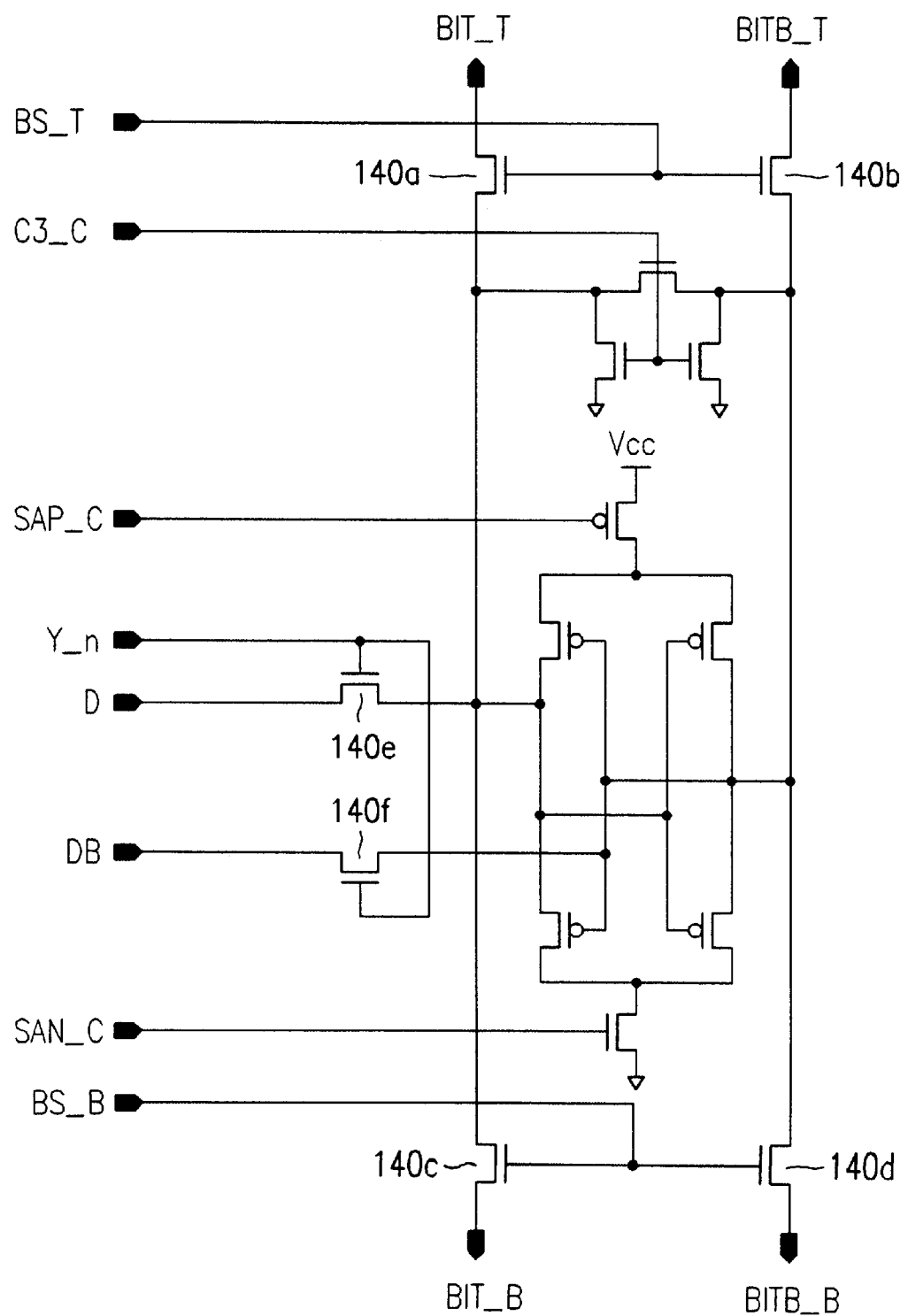
FIG. 14 shows a second preferred embodiment of the sense amplifier and input and output controller according to the present invention.

FIG. 14 shows another embodiment of the sense amplifier and input and output controller according to the present invention. In this embodiment, four NMOS transistors 140a, 140b, 140c and 140d, instead of the four transmission gates 131a, 131b, 131c and 131d, are used. The sense amplifier and input and output controller using the transmission gates of FIG. 13 is better in a low voltage operation than the circuit using the NMOS transistors of FIG. 4.

The sense amplifier and input and output controller 85, which receives the output signal of the local control signal generator 80 and the output signal of the column controller 84, transfers the data from the memory cell to the data bus line D and the data bar bus line DB in the read mode, and transfers the data from the data bus line D and the data bar bus line DB to the memory cell in the write mode.

Figure 15:
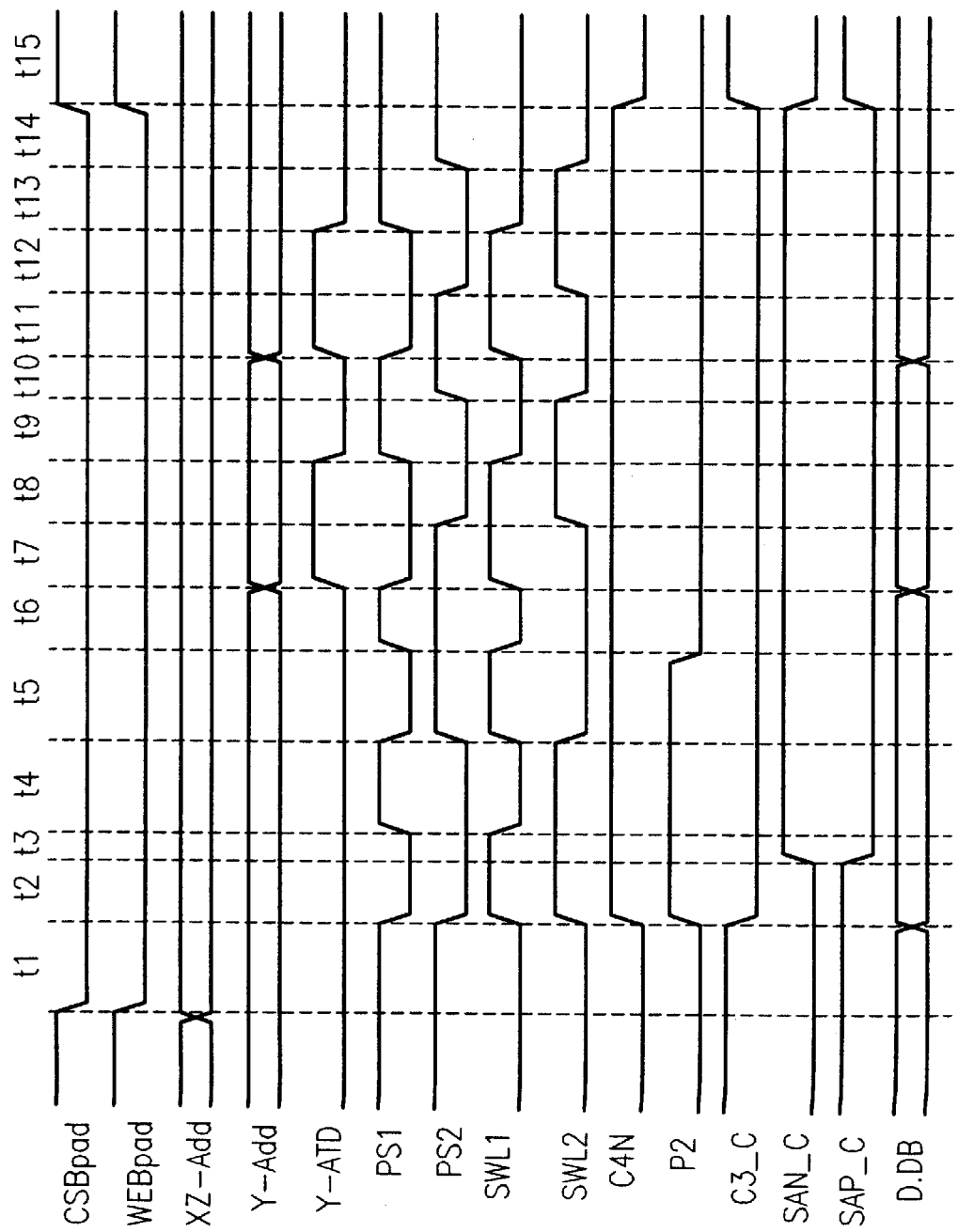
FIG. 15 shows the timing waveforms for the operations of the local control signal generator in the write mode when Y address changes according to a preferred embodiment of the present invention.

FIG. 15 shows the waveforms for the input and output operations of the local control signal generator according to the present invention. The waveforms are the timing charts for the write mode when the chip enable signal CSBpad is enabled in a low state and the Y address is changed.

First, the period from the time that the chip enable signal CSBpad is enabled to a low state to the time that the chip enable signal CSBpad is again disabled to a high state is divided into 15 intervals from t1 to t15. In the interval t1, the signal CSBpad is enabled in a low state and the signal WEBpad is enabled in a low state. At this time, X, Y, Z addresses hold their previous states and each of the output signals PS1, PS2, C4N, C3_C, SAP_C and SAN_C of the local control signal generator 80 also holds its state before the interval t1, respectively.

Thereafter, the signal PS1 is in a high state during the interval t1, in a low state during the intervals t2 and t3, in a high state during the interval t4, in a low state during the interval t5, in a high state during the interval t6, in a low state during the intervals t7 and t8, in a high state during the intervals t9 and t10, in a low state during the intervals t11 and t12, and in a high state after the beginning of the interval t13. The signal SWL1 for the split wordline driver 82 has the opposite polarity against the signal PS1 but has the same transition timing as the signal PS1.

The signal PS2 is in a high state during the interval t1, in a low state during the intervals t2, t3 and t4, in a high state during the intervals t5, t6 and t7, in a low state during the intervals t8 and t9, in a high state during the intervals t10 and t11, in a low state during the intervals t12 and t13, and in a high state after the beginning of the interval t14. The signal SWL2 for the split wordline driver 82 has the opposite polarity against the signal PS2 but has the same transition timing as the signal PS2.

The output signal C4N of the local control signal generator 80 changes to a high state at the beginning of the interval t2 and changes to a low state at the time that the signal CSBpad is disabled. The signal P2 changes to a high state at the beginning of the interval t2, holds the high state by the end of the interval t5 and changes to a low state at the beginning of the interval t6.

The signal C3_C holds its previous high state by the end of the interval t1, changes to a low state at the starting point of the intervals t2, and then changes to a high state at the time that the signal CSBpad is disabled.

The signal SAN_C holds a low state by the end of the interval t2, changes to a high state at the beginning of the intervals t3, and holds the high state by the time that the signal CSBpad is disabled. The signals SAP_C and SAN_C have the opposite polarity with each other but they have the same transition timing.

As shown in FIGS. 9 and 15, the timing charts for the input and output operations of the global control signal generator, if only Y address is changed under the condition that the signal CSBpad is enabled in a low state, there is no change on the input signal of the global control signal generator 76. Therefore, the output signal of the global control signal generator 76 is not changed. When the signal Y-ATD is generated by the change of Y address in a write mode, the output signals PS1 and PS2 of the local control signal generator 80 are obtained and therefrom the signals SWL1 and SWL2 of the split wordline driver 82 are generated.

As shown in the timing charts of FIG. 15, when Y address is changed at the beginning of the interval t7, a logic value 1 is written into the memory cell in the intervals t7 and t9 and a logic value 0 is written into the memory cell in the interval t8. When Y address is changed at the beginning of the interval t11, a high data is written into the memory cell in the intervals t11 and t13 and a low data is written into the memory cell in the interval t12.

Figure 16:
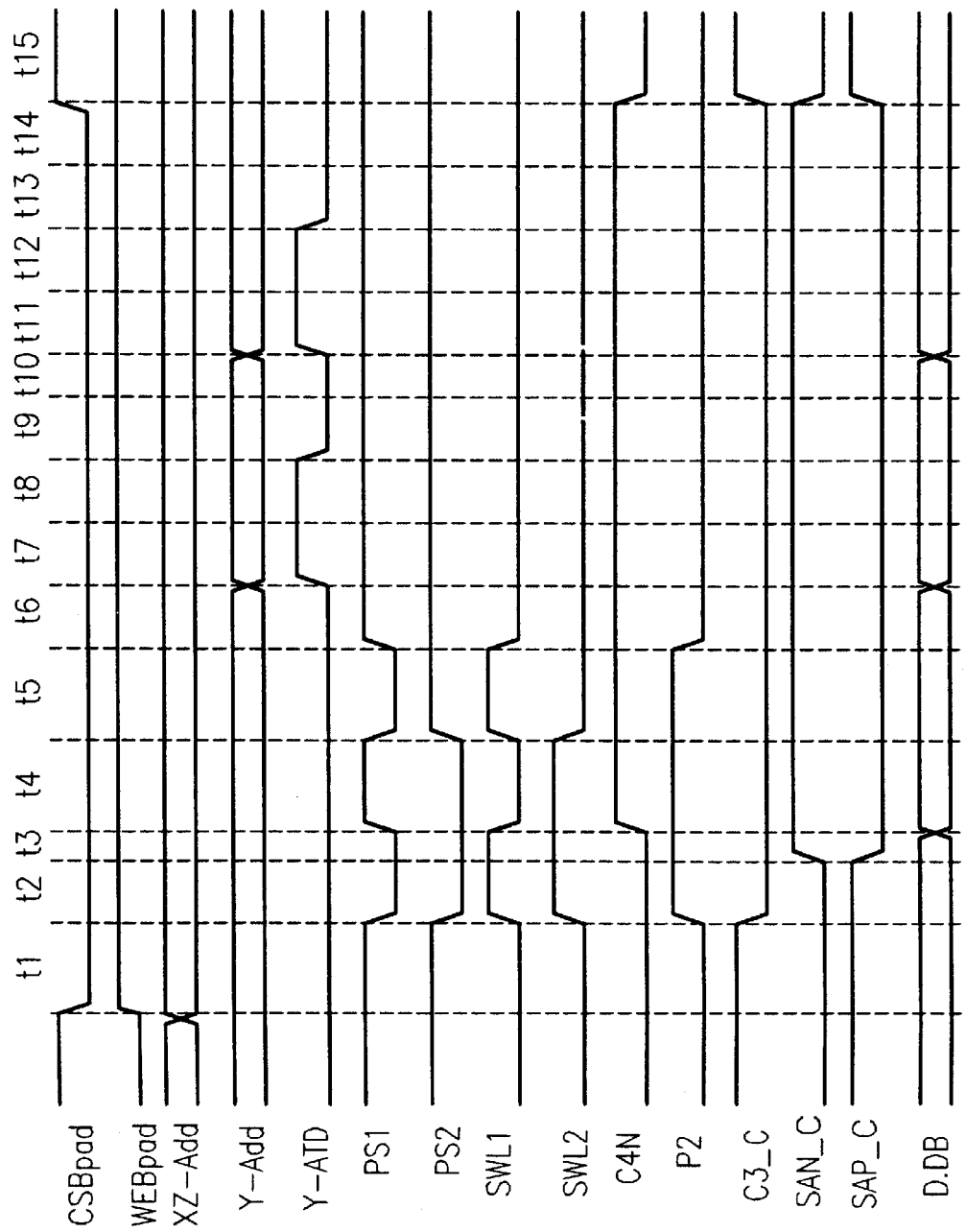
FIG. 16 shows the timing waveforms for the operations of the local control signal generator in the read mode when Y address changes according to a preferred embodiment of the present invention.

FIG. 16 shows the timing waveforms for the operations of the local control signal generator according to the preferred embodiment of the present invention when the only Y address is changed in a read mode. Unlike the write mode, the signal WEBpad holds a high state while the signal CSBpad is in an enabled state. Because the memory is in a read mode, the signal WEBpad must be in a high state.

On the other hand, as in the write mode, the signal Y-ATD goes up to a high state only when the Y address is changed. When Y address is changed at the beginning of the interval t7, Y address holds a high state in the two intervals t7 and t8. When Y address transits at the beginning of the interval t11, the signal Y-ATD again holds a high state in the intervals from t11 to t13. In all intervals except those intervals, the signal Y-ATD holds a low state.

The signal PS1 holds a low state in the intervals t2, t3 and t5, and holds a high state in other intervals. The signal PS2 holds a low state in the intervals t2, t3 and t4, and holds a high state in other intervals. The signal SWL1 and the signal PS1 have the same transition timing but have different polarity from each other.

The signal SWL2 and the signal PS2 also have the same transition timing but have different polarity from each other. The signal C4N holds a high state in the interval t4 and holds a low state in all the other intervals. The waveforms of the four signals P2, C3C_C, SAN_C and SAP_C are the same as those of the write mode. Therefore, the explanation for the waveforms is omitted.

When only Y address is changed under the condition that the signal CSBpad is enabled in a low state, there is no changes in the input signal and the output signal of the global control signal generator.

Even though the signal Y-ATD goes up to a high state by the change of Y address, the signals PS1 and PS2 of the local control signal generator 80 in the read mode are not changed and the signals SWL1 and SWL2 continuously hold their disabled states. Therefore, the column decoder 84 corresponding to the changed Y address is enabled and therefrom the data latched in the sense amplifier is transferred to the data bus.

In the interval t7 that the Y address is first changed, the data of the sense amplifier is transferred to the data bus and the read mode is completed. In the interval t11 that Y address changes for the second time, the data of the sense amplifier is transferred to the data bus and the read mode is completed.

Figure 17:
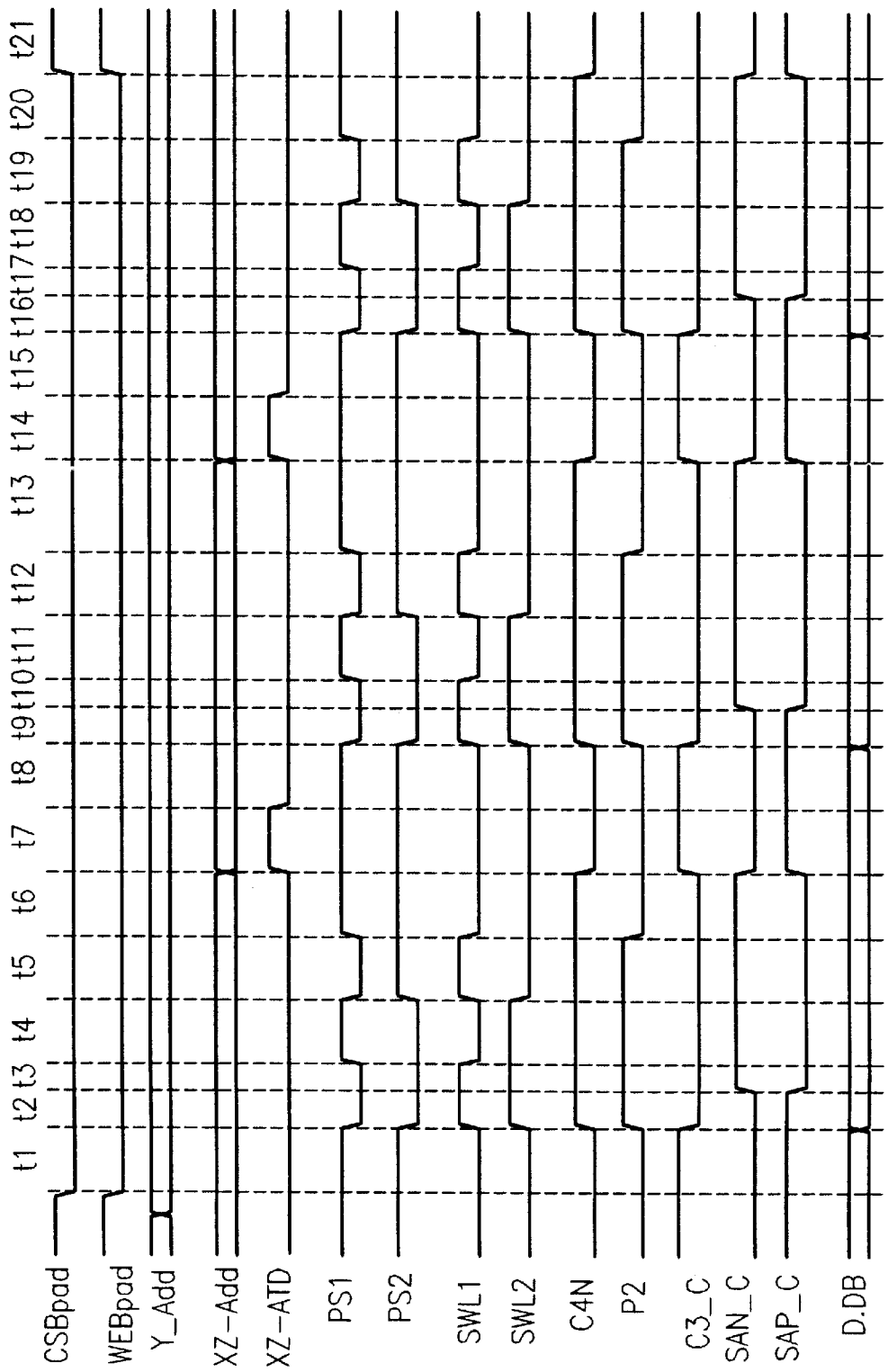
FIG. 17 shows the timing waveforms for the operations of the local control signal generator in the write mode when X, Z addresses are changed according to a preferred embodiment of the present invention.

The above explanation of the timing charts of the non-volatile ferroelectric memory device in the read and write modes is provided when only Y address is changed. Hereafter, the timing waveforms for the operation of the nonvolatile ferroelectric memory device in the read and write modes when only X, Z addresses are changed when the memory device is will be explained with reference to FIG. 17. As shown, the period for the whole operation of the nonvolatile ferroelectric memory device according to a preferred embodiment of the present invention is divided into 21 intervals from t1 to t21.

At the beginning time of the interval t1, the signal CSBpad goes to an enabled state by a transition from its previous high state to a low state and then goes back to a disabled state at the beginning of the interval t21. At the same time, the write enable signal WEBpad goes down to a low state, holds the low state as its active state, and goes up to a disabled high state at the time that the signal CSBpad is disabled. The signals WEBpad and CSBpad are externally provided. In the interval t1, only the signals CSBpad and WEBpad are enabled and all other signals hold their previous states.

In the interval t2, the signals CSBpad and WEBpad hold their enabled states and the signals PS1, PS2 and C3_C go down to a low state from their previous high states. The signals SWL1, SWL2 and C4N and P2 go up to a high state from their previous low states, respectively. When the signal C4N is enabled by the transition from a low state to a high state, the data, which was externally transferred, is loaded on the bitline BL and the bitbarline BBL.

In the interval t3, each of said all signals CSBpad, WEBpad, PS1, PS2, SWL1, SWL2, C3_T, C4N and P2 hold their previous states from the interval t2. The signal SAN_C transits from its previous low state to a high state, and the signal SAP_T goes down from a high state to a low state. At this time, said signal SAN_C goes up to a high state and said signal SAP_C goes down to a low state.

In the interval t4, only the signals PS1 and SWL1 are changed from their previous states. In other words, the signal PS1 goes up to a high state from its previous low state and the signal SWL1 goes down to a low state from its previous high state.

In the interval t5, only the signals PS1, PS2, SWL1 and SWL2 changes and all other signals hold their states of the interval t4. In other words, the signal PS1 goes to a low state from its previous high state and therefore the signal SWL1 goes to a high state from a low state. The signal PS2 goes to a high state from its previous low state and therefore the signal SWL2 goes to a low state from a high state.

At the beginning of the interval t6, the signals, except the three signals PS1, SWL1 and P2, maintain previous state, respectively. Therefore, in the interval t6, the signal PS1 goes up to a high state from its previous low state of the interval t5 and therefrom the signal SWL1 goes down to a low state from its high state. The signal P2 goes down to a low state from its previous high state.

When the signals X, Z addresses are changed in the interval t7, the signals X, Z-ATD go up to a high state from a low state. Then, each of the signals C4N and SAN_C goes to a low state from its previous high state, respectively, and each of the signals C3_C and SAP_C goes to a high state from its previous low state, respectively. At the beginning of the interval t8, only the signals X, Z-ATD go down to a low state from their previous high states and all the signals except X, Z-ATD hold their previous states of the interval t7.

At the beginning of the interval t9, only the signals X, Z-ATD, SAN_C and SAP_C hold their previous states and all other signals change their states. In other words, each of the signals PS1 and PS2 goes down to a low state from its previous high state and each of the signals SWL1 and SWL2 goes up to a high state from its previous low state, respectively. Each of the signals C4N and P2 goes up to a high state from its previous low state, respectively, and the signal C3_C goes down to a low state from its previous high state. When the signal C4N is enabled by the transition from a low state to a high state, an external data is loaded on the bitline BL and the bitbarline BBL.

At the beginning of the interval t10, the signal SAN_C goes up to a high state from a low state and said signal SAP_C goes down to a low state from a high state, and all other signals hold their states from the interval t9.

At the beginning of the interval t11, the signal PS1 goes up to a high state from its previous low state and the signal SWL1 goes up to a low state from its previous high state, and all other signals hold their previous states.

At the beginning of the interval t12, the signal PS1 goes down to a low state from its previous high state and the signal PS2 goes up to a high state from its previous low state. Therefore, the signal SWL1 goes up to a high state from its low state and the signal SWL2 goes down to a low state from its previous high state, and all other signals hold their previous states of the interval t11.

At the beginning of the interval t13, the signals PS1, SWL1 and P2 change their states and all other signals hold their states of the interval t12. In other words, the signal PS1 goes up to a high state from its previous low state and the signal SWL1 goes down to a low state from its high state. The signal P2 goes down to a low state from its previous high state.

At the beginning of the interval t14, the signals X, Z addresses are changed. Therefore, the signal X, Z-ATD goes up to a high state from its previous low state and the signals C4_C and SAN_C go down to a low state from their high states. The signals C3_C and SAP_C go up to a high state from their low states.

At the beginning of the interval t15, the signal X, Z-ATD goes down to a low state from its previous high state and all the other states hold their high states of the interval t14. At the beginning of the interval t16, the signals PS1 and PS2 go down to a low state from their high states and the signals SWL1 and SWL2 go up to a high state from their low states.

The waveforms of the intervals from t17 to t20 are the same as the waveforms of the intervals from t10 to t13, and therefore the explanations about them are omitted. At the beginning of the interval t21, both of the signals CSBpad and WEBpad which have continuously been held their low states from the interval t1 go up to a high state and therefrom the write mode goes to a disabled state. At this time, the signal C4N goes down to a low state from its previous high state, the signal SAN_C goes down to a low state from its previous high state, and the signal SAP_C go up to a high state from its low state.

Thus, when X, Z addresses are changed in a write mode, the local control signal generator according to the present invention enables the signal C4N at the time that the signals SWL1 and SWL2 go into a enabled state and therefrom the data to be written is loaded on the bitline before the sense amplifier is enabled.

Figure 18:
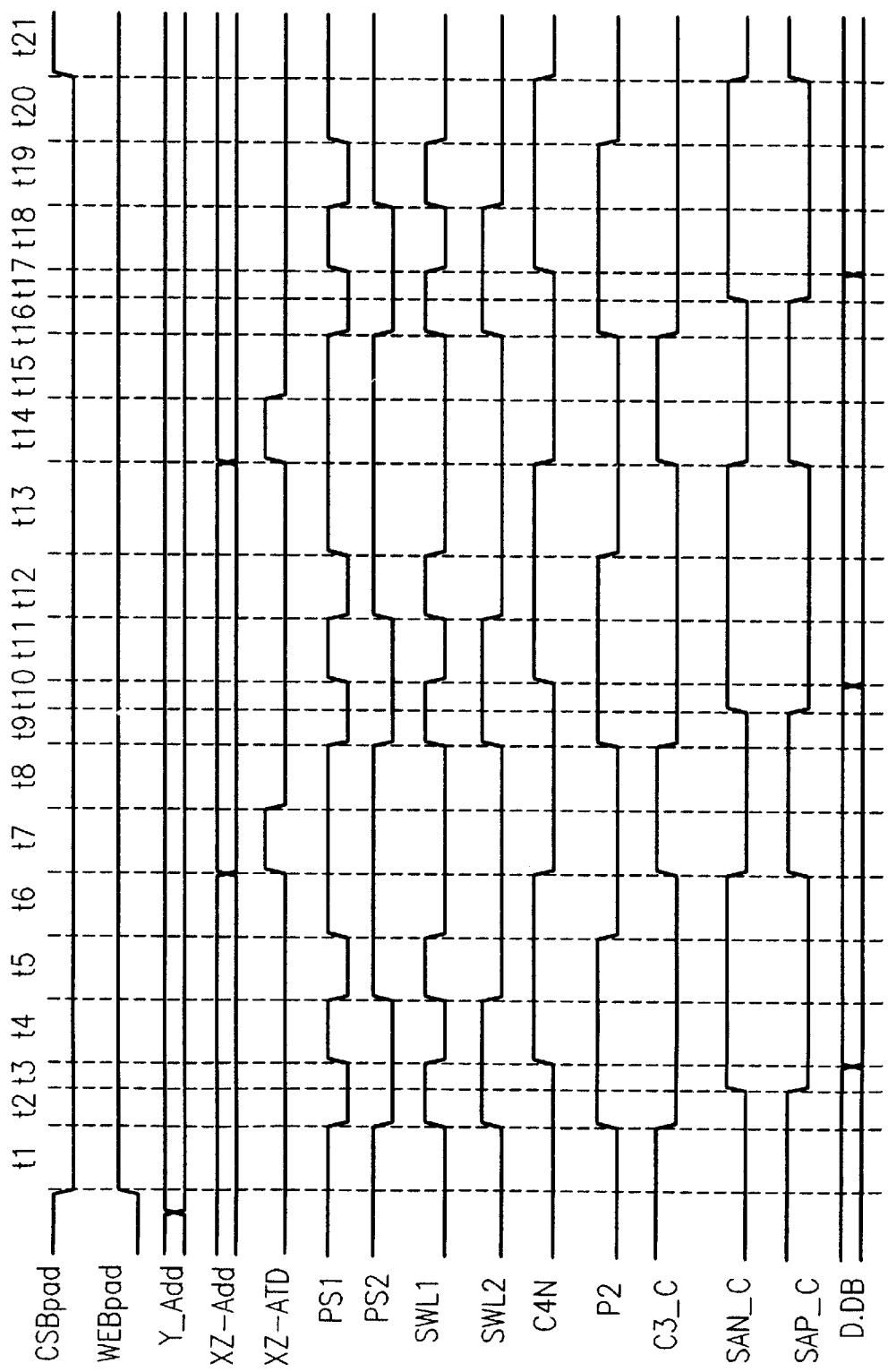
FIG. 18 shows the timing waveforms for the operations of the local control signal generator in the read mode when X, Z addresses are changed according to a preferred embodiment of the present invention.

FIG. 18 shows the waveforms for the local control signal generator according to the present invention when only X, Z addresses are changed in a read mode. Compared to FIG. 17, the transition timing charts of the signal C4N are different from each other. While the signal WEBpad is enabled in a low state in the write mode in FIG. 17, the signal WEBpad in the read mode is enabled in a high state as shown in FIG. 18. All the signals except the signal C4N in FIG. 18 have the same waveforms as those of the write mode in FIG. 17. Therefore, only the signal C4N is explained in the following.

As shown in FIG. 18, the signal C4N holds a low state in the interval from t1 to t3. At the beginning of the interval t4, the signal C4N is enabled by the transition from a low state to a high state and the data amplified by the sense amplifier is loaded on the data line and the data bar line.

The signal C4N which is enabled in a high state at the beginning of the interval t4 holds the high state by the end of the interval t6 and then goes down to a low state at the beginning of the interval t7. The low state of the signal C4N is held by the end of the interval t110.

At the beginning of the interval t11, the signal C4N goes up to a high state. At the same time, the data amplified by the sense amplifier is loaded onto the data line and the data bar line. Thus, the read mode is done according to the sequence that the sense amplifier senses the data in advance and then the signal C4N is enabled and the data sensed by the amplifier is loaded onto the data line and the data bar line.

The device according to the present invention has a normal operation controlled by the changes of X, Y, Z addresses in addition to the signal CSB. In other words, the device according to the present invention operates according to each of the changes of two cases classified into only X, Z address change and only Y address change. When the signal CSBpad is enabled and therefrom the operation of the memory device of the present invention is not yet completed, the normal operation of the device of the present invention is not disturbed even though X, Y, Z addresses are changed. When only X, Z addresses are changed, there is no data latched by the sense amplifier and therefore the operation being performed when the signal CSBpad is enabled is performed by using the signal X, Z-ATD.

Third, when only Y address is changed, the wordline (SWL1 and SWL2) corresponding to a row address is not changed and therefore the data latched by the sense amplifier according to first normal operation is read out. In the write mode, a write operation is normally done by using the signal Y-ATD. Therefore, the operation is done in a fast column access mode and the chip access speed and performance are improved.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A ferroelectric memory device, comprising:
    a first memory array having a plurality of ferroelectric memory cells, a plurality of pairs of first and second split wordlines in a first direction and plurality of first and second bitlines in a second direction, each ferroelectric memory cell coupled to a corresponding pair of first and second split wordlines in the first direction and coupled to corresponding first and second bitlines in the second direction;
    a first split wordline driver coupled to said pairs of first and second split wordlines of said first memory array, wherein said first split wordline driver provides first and second split wordline signals to the pair of first and second wordlines to a selected ferroelectric memory cell; and
    a first controller coupled to said first split wordline driver, said first controller detects changes in addresses applied thereto to control data input and output from the selected ferroelectric memory cell coupled to the corresponding pair of first and second split wordlines and corresponding first and second bitlines.

2. The ferroelectric memory device of claim 1, wherein each ferroelectric memory cell comprises:
    a first transistor having a control electrode and first and second electrodes, the control electrode being coupled to the first split wordline and the first electrode coupled to the first bitline;
    a first capacitor having first and second electrodes with a ferroelectric material therebetween, the first electrode of the first capacitor being coupled to the second split wordline and the second electrodes of said first capacitor and said first transistor being coupled to each other;
    a second transistor having a control electrode and first and second electrodes, the control electrode being coupled to the second split wordline and the first electrode coupled to the second bitline; and
    a second capacitor having first and second electrodes with a ferroelectric material therebetween, the first electrode of said second capacitor being coupled to the first split wordline and the second electrodes of said second capacitor and said second transistor being coupled to each other.

3. The ferroelectric memory device of claim 1 further comprising a second memory array having the same arrangement as the first memory array, said first split wordline driver being located between said first and second memory arrays.

4. The ferroelectric memory device of claim 3, further comprising
    a third memory array having the same configuration as said first memory array, said first controller located between said first and third memory arrays;
    a second split wordline driver coupled to said first controller and said third memory array;
    a fourth memory array having the same configuration as said first memory array, said second split wordline driver being located between said third and fourth memory arrays; and
    a second controller that detects changes in addresses applied thereto to control data input and output from the selected ferroelectric memory cell in one of said second and fourth memory arrays, wherein said first controller controls data input and output from the selected ferroelectric memory cell in one of said first and third memory arrays.

5. The ferroelectric memory device of claim 3, wherein said first split wordline driver is responsive to at least one of said first and second controllers to provide the first and second split wordline signals to the selected ferroelectric memory cell in at least one of said first and second memory arrays and said second split wordline driver is responsive to at least one of said first and second controllers to provide the first and second split wordline signals to the selected ferroelectric memory cell in at least one of said third and fourth memory arrays.

6. The ferroelectric memory device of claim 1, wherein said first controller includes:
    a first address circuit to receive a first address signal, which is decoded such that said first address circuit provides a decoded first address signal corresponding to a row of said first memory array;
    a first global control generator coupled to said first address circuit for receiving a first signal indicative of a change in the first address signal, said first global control signal generating a plurality of first global control signals in response to the first signal and externally applied control signals;
    a second address circuit coupled for receiving a second address signal, which is decoded such that said second address circuit provides a decoded second address signal corresponding to a column of said first memory array; and
    a first local control generator coupled to said first global control generator and said second address circuit, said first local control generator responsive to said plurality of first global control signals and a second signal indicative of a change in the second address signal to generate a plurality of first local control signals, wherein said first split wordline driver being responsive to the first local control signals and the decoded first address signal to generate the first and second split wordline signals for the selected ferroelectric memory cell coupled to the pair of first and second split wordlines in the first direction corresponding to the decoded first address signal; and
    a first input and output circuit coupled to said first local control generator, said second address signal and said first memory array, said first input and output circuit being responsive to the first local control signals and the decoded second address signal such that the first and second bitlines corresponding to the decoded second address signal are enabled for one of reading data stored in the selected ferroelectric memory cell and writing data into the selected ferroelectric memory cell.

7. The ferroelectric memory device of claim 6, wherein said first address circuit comprises:

a first address buffer that receives the first address signal;

a first address decoder decoding the first address signal to the decoded first address signal, which is provided to said first split wordline driver; and a first address transition detector which detects the change in the first address signal.

8. The ferroelectric memory device of claim 6, wherein said second address circuit comprises:

a second address buffer that receives the second address signal;

a second address decoder decoding the second address signal to the decoded second address signal, which is provided to said first input and output circuit; and a second address transition detector which detects the change in the second address signal.

9. The ferroelectric memory device of claim 6, wherein said first input and output circuit comprises:

a plurality of first sense amplifiers whose input and output terminals are coupled to corresponding first and second bitlines of said first memory array;

a first equalization circuit for equalizing said plurality of first and second bitlines to a prescribed potential;

a first input and output controller which controls input and output operations of said plurality of sense amplifiers; and a first column controller responsive to the decoded second address signal and a corresponding first local control signal for controlling said first input and output controller.

10. The ferroelectric memory device of claim 4, wherein said first controller includes:

a first address circuit to receive a first address signal, which is decoded such that said first address circuit provides a decoded first address signal;

a second address circuit coupled for receiving a second address signal, which is decoded such that said second address circuit provides a decoded second address signal;

a third address circuit coupled for receiving a third address signal, which is decoded such that said third address circuit provides a decoded third address signal;

a first global control generator coupled for receiving a first signal indicative of a change in at least one of the first and third address signals, said first global control signal generating a plurality of global control signals in response to the first signal and externally applied control signals; and a first local control generator coupled to said first global control generator, said second address circuit and said third address circuit, said first local control generator responsive to the plurality of global control signals, the decoded third address signal and a second signal indicative of a change in the second address signal to generate a plurality of first local control signals, wherein said first split wordline driver being responsive to the first local control signals and a combined signal of the decoded first and third address signals to generate the first and second split wordline signals for the selected ferroelectric memory cell coupled to the pair of first and second split wordlines in the first direction corresponding to the decoded first address signal in at least one of said first and third memory arrays; and a first input and output circuit coupled to said first local control generator, said second address circuit and said first memory array, said first input and output circuit being responsive to the first local control signals and the decoded second address signal such that the first and second bitlines corresponding to the decoded second address signal are enabled for one of reading data stored in the selected ferroelectric memory cell in at least one of said first and third memory arrays and writing data into the selected ferroelectric memory cell in at least one of said first and third memory arrays.

11. The ferroelectric memory device of claim 10, wherein said first address circuit comprises:

a first address buffer that receives the first address signal;

a first address decoder decoding the first address signal to the decoded first address signal;

a transition detector which detects the change in at least one of the first and third address signals; and a post decoder that combines the decoded first and third address signals, and provides the combined signal to the first split wordline driver.

12. The ferroelectric memory device of claim 10, wherein said second address circuit comprises:

a second address buffer that receives the second address signal;

a second address decoder decoding the second address signal to the decoded second address signal, which is provided to said first input and output circuit; and an address transition detector which detects the change in the second address signal.

13. The ferroelectric memory device of claim 10, wherein said third address circuit comprises:

a third address buffer that receives the third address signal;

a third address decoder decoding the third address signal to the decoded third address signal, which is provided to said first split wordline driver;

a transition detector which detects the change in at least one of the first and third address signals; and a post decoder that combines the decoded first and third address signals, and provides the combined signal to the first split wordline driver.

14. The ferroelectric memory device of claim 10, wherein said first input and output circuit comprises:

a plurality of first sense amplifiers whose input and output terminals are coupled to corresponding first and second bitlines of at least one of said first and third memory arrays;

a first equalization circuit for equalizing said plurality of first and second bitlines of at least one of said first and third memory arrays to a prescribed potential;

a first input and output controller which controls input and output operations of said plurality of sense amplifiers; and a first column controller responsive to the decoded second address signal and a corresponding first local control signal for controlling said first input and output controller.

15. The ferroelectric memory device of claim 14, wherein said second controller has a substantially same structure as said first controller for inputting and outputting data for at least one of said second and fourth memory arrays.

16. The ferroelectric memory device of claim 10, wherein said first global control generator comprises:
    an input buffer that receives the first signal and externally applied signal consisting of an enable signal and power-up detection to generate first and second synchronization signals;
    a low voltage operation and noise reduction circuit receiving the first synchronization signal to generate a low voltage operation and noise filtered signal and a pre-activation pulse signal;
    a first controller circuit receiving the low voltage operation and noise filtered signal to generate first, second and third control signals;
    a second controller circuit receiving the third control signal to generate first, second and third global signals applied to the first local control generator for generating the first and second split wordline signals, said second controller generating a fourth control signal, which is fed-back to said low voltage operation and noise reduction circuit;
    a third controller circuit receiving the first and second synchronization signals and the fourth control signal to generate fifth and sixth control signals for controlling an enablement timing of said first and second global signals; and
    a fourth controller circuit receiving the fifth and sixth control signals, the pre-activation pulse signal and first and second synchronization signals for generating fourth, fifth, sixth and seventh global control signals which is applied to said first local control generator for controlling said first input and output circuit.

17. The ferroelectric memory device of claim 14, wherein said first local generator includes:
    a first logic circuit for performing a logic operation on a first group of global control signals received from said first global control generator and the decoded third address signal and generating first resultant signals of the first local control signals to control said first input and output circuit;
    a second logic circuit for performing a logic operation on a second group of global control signals received from said first global signal generator and an externally applied write enable signal and generating a second resultant signal of the first local control signals; and
    a third logic circuit for performing a logic operation on a third group of global control signals from said first global control generator and the second signal and generating third resultant signals of the first local control signals to control said first split wordline driver.

18. The ferroelectric memory device of claim 17, wherein said first logic circuit includes:
    a first logic operation unit which performs a logic operation on the decoded third address signals for generating corresponding first resultant signals to control said first input and output controller;
    a second logic operation unit which performs a logic operation on the first group of global control signals to generate corresponding first resultant signals to control said plurality of first sense amplifiers; and
    a third logic operation unit which performs a logic operation on the first group of global control signals to generate corresponding first resultant signals to control said first column controller.

19. The ferroelectric memory device of claim 18, wherein said first logic operation unit includes:
    a first NAND gate performing a logic operation the decoded third address signal to generate a signal for selecting said first memory array;
    a second NAND gate performing a logic operation on the decoded third address signal to generate a signal for selecting said third memory array;
    a third NAND gate performing a logic operation on outputs of said first and second NAND gates;
    a first inverter inverting the output of said first NAND gate and generating a signal for controlling a connection between a corresponding bitline of said first memory array and a corresponding first sense amplifier;
    a second inverter inverting the output of said first inverter and generating a signal for controlling a connection between a corresponding second bitline of said first memory array and a corresponding first sense amplifier;
    a third inverter inverting the output of said second NAND gate and generating a signal for controlling a connection between a corresponding first bitline of said third memory array and a corresponding first sense amplifier; and
    a fourth inverter inverting the output of said third inverter and generating a signal for controlling a connection between a corresponding second bitline of said third memory array and a corresponding first sense amplifier.

20. The ferroelectric memory device of claim 18, wherein said second logic operation unit includes:
    a fourth NAND gate performing a logic operation on a corresponding first group of global control signals and an output signal of the third NAND gate of said first logic operation unit;
    a fifth NAND gate performing a logic operation on a corresponding first group of global control signals and the output signal of the third NAND gate of said first logic operation unit;
    a fifth inverter inverting the output of said fourth NAND gate and generating a control signal for enabling a corresponding first sense amplifier; and
    a sixth inverter inverting the output of said fifth NAND gate and generating a control signal for enabling a corresponding first sense amplifier.

21. The ferroelectric memory device of claim 18, wherein said third logic operation unit includes:
    a seventh inverter inverting the output signal of a corresponding first group of said global control generator;
    a sixth NAND gate performing a logic operation on an output signal of the seventh inverter and the output signal of the third NAND gate;
    an eighth inverter inverting the output of said sixth NAND gate; and
    a ninth inverter inverting the output of said eighth inverter to generate a corresponding first resultant signal to control said first column controller.

22. The ferroelectric memory device of claim 17, wherein said second logic circuit includes:
    a tenth inverter inverting the externally applied write enable signal;
    an eleventh inverter inverting an output of the tenth inverter;
    a twelfth inverter inverting a corresponding global control signal of said global control signal generator;
    a seventh NAND gate performing a logic operation on output signals of said eleventh and twelfth inverters;

a thirteenth inverter inverting an output of said seventh NAND gate;

a first NOR gate performing a logic operation on an inverted output signal of the third NAND gate of said first logic operation unit, the output signal of the thirteenth inverter and an output signal of said global control signal generator;

a fifteenth inverter inverting an output of said first NOR gate; and a sixteenth inverter inverting an output of said fifteenth inverter to control said first column controller.

23. The ferroelectric memory device of claim 17, wherein said third logic circuit includes:

a fourth logic operation unit performing a logic operation on a signal from the first logic operation unit, the third group of global control signals and the second signal indicative of the change in the second address signal and applying a corresponding third resultant signal to said first split wordline driver for generating the second split wordline signal; and a fifth logic operation unit performing a logic operation on said first logic operation unit and a corresponding global control signal and applying a corresponding third resultant signal to said first split wordline driver for generating the first split wordline signal.

24. The ferroelectric memory device of claim 23, wherein said fourth logic operation unit includes:

a seventeenth inverter inverting a corresponding global control signal of the global control generator;

an eighth NAND gate performing a logic operation on a corresponding global control signal output signal, an output signal of said seventeenth inverter and the second signal;

an eighteenth inverter inverting an output signal of said eighth NAND gate;

a delay unit delaying the output signal of the eighteenth inverter by a prescribed period of time;

a second NOR gate performing a logic operation on an output signal of said delay unit and a corresponding global control signal;

a third NOR gate performing a logic operation on an output signal of said second NOR gate and an output signal of said first logic operation unit; and a nineteenth inverter inverting the output signal of said third NOR gate for said first split wordline driver to generate the second split wordline signal.

25. The ferroelectric memory device of claim 24, wherein said delay unit includes an even number of inverters connected in series.

26. The ferroelectric memory device of claim 23, wherein said fifth logic operation unit includes:

a fourth NOR gate performing a logic operation on an output signal of said fourth logic operation unit and an output signal of said global control generator;

a fifth NOR gate performing a logic operation on an output signal of said first logic operation unit and an output signal of said fourth NOR gate; and a twentieth inverter inverting an output signal of said fifth NOR gate for said first split wordline driver to generate the first split wordline signal.

27. The ferroelectric memory device of claim 9, wherein said first input and output controller comprises:

a first switch selectively connecting the corresponding first and second bitlines of said first memory array to a corresponding first sense amplifier; and a second switch selectively connecting input and output terminals of the corresponding first sense amplifier to first and second data lines.

28. The ferroelectric memory device of claim 27, wherein said first switch comprises a first transmission gate that selectively connects the corresponding first bitline to the corresponding first sense amplifier and a second transmission gate that selectively connects the corresponding second bitline to the corresponding first sense amplifier; and said second switch comprises a third transmission gate that selectively connects the first data line to the corresponding first sense amplifier and a fourth transmission gate that selectively connects the second data line to the corresponding first sense amplifier.

29. The ferroelectric memory device of claim 27, wherein said first switch comprises a first transistor that selectively connects the corresponding first bitline to the corresponding first sense amplifier and a second transistor that selectively connects the corresponding second bitline to the corresponding first sense amplifier; and said second switch comprises a third transistor that selectively connects the first data line to the corresponding first sense amplifier and a fourth transistor that selectively connects the second data line to the corresponding first sense amplifier.

30. The ferroelectric memory device of claim 9, wherein said first column controller comprises:

a plurality of logic gates, each receiving the decoded second address signal and the corresponding first local control signal and an output terminal of each logic gate being connected to a pair of second address signal paths and one of the pair of second address signal paths having an inverter.

31. The ferroelectric memory device of 9, wherein said first equalization circuit comprises first to third transistors and each of said first sense amplifiers comprises fourth to ninth transistors, each transistor having a control electrode and first and second electrodes, wherein the control electrodes of first to third transistors are coupled for receiving a prescribed control signal, the first electrodes of first and second transistors are coupled to each other, the second electrode of the first transistor and the first electrode of the third transistor are coupled to each other, and the second electrodes of the second and third transistors are coupled for receiving a ground potential, and the control electrodes of fourth and ninth transistors are coupled for receiving sense enable signals and first electrodes of the fourth and ninth transistors are coupled for receiving source and ground potentials, respectively, the second electrode of the fourth transistor is coupled to the first electrodes of the fifth and sixth transistors and the second electrode of the ninth transistor is coupled to the second electrodes of the seventh and eighth transistors, the control electrodes of the fifth and seventh transistors, the second electrode of the sixth transistor and the first electrode of the eighth transistor are coupled to the second bitline and the first input and output controller, and the control electrodes of the sixth and eighth transistors, the second electrode of the first transistor and the second electrode of the seventh transistor are coupled to the first bitline.

32. The ferroelectric memory device of claim 14, wherein said first input and output controller comprises:

a first switch selectively connecting the corresponding first and second bitlines of said first memory array to a corresponding first sense amplifier;

a second switch selectively connecting input and output terminals of the corresponding first sense amplifier to first and second data lines; and a third switch selectively connecting the corresponding first and second bitlines of said third memory array to the corresponding first sense amplifier.

33. The ferroelectric memory device of claim 32, wherein said first switch comprises a first transmission gate that selectively connects the corresponding first bitline of said first memory array to the corresponding first sense amplifier and a second transmission gate that selectively connects the corresponding; second bitline of said first memory array to the corresponding first sense amplifier;

said second switch comprises a third transmission gate that selectively connects the first data line to the corresponding first sense amplifier and a fourth, transmission gate that selectively connects the second data line to the corresponding first; sense amplifier; and said third switch comprises a fifth transmission gate that selectively connects the corresponding first bitline of said third memory array to the corresponding first sense amplifier and a sixth transmission gate that selectively connects the corresponding second bitline of said third memory array to the corresponding first sense amplifier.

34. The ferroelectric memory device of claim 32, wherein said first switch comprises a first transistor that selectively connects the corresponding first bitline of said first memory array to the corresponding first sense amplifier and a second transistor that selectively connects the corresponding second bitline of said first memory array to the corresponding first sense amplifier;

said second switch comprises a third transistor that selectively connects the first data line to the corresponding first sense amplifier and a fourth transistor that selectively connects the second data line to the corresponding first sense amplifier; and said third switch comprises a fifth transistor that selectively connects the corresponding first bitline of said third memory array to the corresponding first sense amplifier and a sixth transistor that selectively connects the corresponding second bitline of said third memory array to the corresponding first sense amplifier.

35. The ferroelectric memory device of claim 14, wherein said first column controller comprises:

a plurality of logic gates, each receiving the decoded second address signal and the corresponding first local control signal and an output terminal of each logic gate being connected to a pair of second address signal paths and one of the pair of second address signal paths having an inverter.

36. The ferroelectric memory device of 14, wherein said first equalization circuit comprises first to third transistors and each of said first sense amplifiers comprises fourth to ninth transistors, each transistor having a control electrode and first and second electrodes, wherein the control electrodes of first to third transistors are coupled for receiving a prescribed control signal, the first electrodes of first and second transistors are coupled to each other, the second electrode of the first transistor and the first electrode of the third transistor are coupled to each other, and the second electrodes of the second and third transistors are coupled for receiving a ground potential, and the control electrodes of fourth and ninth transistors are coupled for receiving sense enable signals and first electrodes of the fourth and ninth transistors are coupled for receiving source and ground potentials, respectively, the second electrode of the fourth transistor is coupled to the first electrodes of the fifth and sixth transistors and the second electrode of the ninth transistor is coupled to the second electrodes of the seventh and eighth transistors, the control electrodes of the fifth and seventh transistors, the second electrode of the sixth transistor and the first electrode of the eighth transistor are coupled to the second bitline and the first input and output controller, and the control electrodes of the sixth and eighth transistors, the second electrode of the first transistor and the second electrode of the seventh transistor are coupled to the first bitline.

37. A nonvolatile ferroelectric memory device having a global control signal generator to generate control signals which includes a first preparatory signal to generate a signal for controlling a column controller, a second preparatory signal to generate a pull down and equalizer enable signal, third preparatory signals to generate sense amplifier enable signals and a pair of fourth preparatory signals to generate signals to be applied to first and second split word lines, each memory cell coupled to a pair of first and second split word lines, a method of operating the nonvolatile ferroelectric memory device based on the control signals comprising the steps of:

(a) during a first time interval, generating a chip enable signal, generating, the first preparatory signal of a low state, generating the second preparatory signal of a high state, generating the third preparatory signals indicative of a disabled state and generating the pair of fourth preparatory signals of a low state;

(b) during a second time interval, maintaining the low state of the first preparatory signal and transiting the second preparatory signal to a low state, transiting the third preparatory signal to an enabled state and generating the pair of fourth preparatory signals of a high state;

(c) during a third time interval, transiting the first preparatory signal to a high state maintaining the previous state of the second and third preparatory signals, and transiting one of the fourth preparatory signals to a low state and maintaining the previous state of the other fourth preparatory signal; and (d) during a fourth time interval, transiting one of the fourth preparatory signals from the low state to a high state, and transiting the other preparatory signal from the high state to a low state while the first, second and third preparatory signals maintain the previous states.

38. The method of claim 37 further comprising the steps of:

(e) during a fifth time interval, transiting one of the fourth preparatory signals to a low state till a Y-address signal changes while the first, second and third preparatory signals and the other fourth preparatory signal hold their states of the fourth time interval; and (f) repeating step (e) at least once until the Y-address signal is changed for the second time and therefrom the signal Y-ATD signal changes to a high state.

39. The method of claim 38, wherein when the chip enable signal changes to a disable state, the first preparatory signal changes to a low state and the second preparatory signal changes to a high state and the third preparatory signal changes to a disabled state.

40. The method of claim 37 further comprising:
(e) during a fifth time interval, when X and Z address signals changes and X, Z-ATD signal changes to a high state, maintaining the first, second and third preparatory signals and the other fourth preparatory signal to the previous states of the fourth time interval and one of fourth preparatory signals changes to a low state; and
(f) repeating step (e) at least once until the X and Z address signals changes again and until X,Z-ATD signal changes again.

41. A nonvolatile ferroelectric memory device having a plurality of first and second bit lines, a plurality of first and second split word lines formed in the direction intersecting the bit lines and a plurality of memory cells, each memory cell is coupled to corresponding first and second bit lines and corresponding first and second split word lines, a method of writing and/or reading data of the nonvolatile ferroelectric memory device comprising the steps of:
when a chip enable signal is indicative of an enable state and a write enable signal is indicative of a write mode by a write enable signal and one of Y address signal and X, Z address signal changes states, writing a logic value "1" a corresponding memory cell during a time interval when the states of the first and second split word lines are different from each other and writing a logic value "0" into the corresponding memory cell during a time interval when both states of the first and second split word lines are in a same state; and
when the chip enable signal is indicative of an enable state, the nonvolatile ferroelectric memory device goes into a read mode and one of Y address and X, Z address signals changes, a data latched by a sense amplifier is loaded onto a data bus by continuously keeping the disabled states of the first and second split word lines.

42. A nonvolatile ferroelectric memory device having a local control signal generator to generate control signals which includes a first signal to be applied to a column controller, a second signal to enable a pull down and equalizer, third signals to enable a sense amplifier and fourth signals to be applied to first and second split word lines, each memory cell being coupled to a pair of first and second split word lines, a method of operating the nonvolatile ferroelectric memory device based on the control signals comprising the steps of:
(a) during a first time interval in which the first and second split word lines are at a low state, generating a chip enable signal when one of (1) a write enable signal is a low state and the ferroelectric memory device is in a write mode and (2) the write enable signal is a high state and the ferroelectric memory device is in a read mode, generating the first control signal of a low state, the second control signal of a high state, and the third control signal of a disabled state;
(b) during a second time interval in which the first and second split word lines are at a high state, generating the second control signal of a low state and the third control signal is indicative of an enabled state;
(c) during a third time interval in which the first and second split word lines are in low and high states, respectively, and (1) when the nonvolatile ferroelectric memory device is in the write mode, maintaining the states of first, second and third control signals during the second time interval, (2) when the nonvolatile ferroelectric memory device is in the read mode, generating the first control signal of a high state and maintaining the states of the second and third control signals during the second time interval;
(d) during a fourth time interval in which the first and second split word lines are in high and low states, respectively, maintaining the state of the first, second and third control signals during the third time interval; and
(e) during a fifth time interval in which the first and second split word lines are in a low state, maintaining the states of the first, second and third control signals during the fourth time interval.

43. The method of claim 42, wherein when the nonvolatile ferroelectric memory device is in the write mode, the method further comprising the steps of:
(f) during a sixth time interval in which a Y-address signal changes, and therefrom a Y-ATD signal changes to a high state, generating the first split word line of a high state and the second split word line of a low state;
(g) during a seventh time interval, generating the first and second split word lines of a high state;
(h) during an eighth time interval, generating the first split word line of a low state and the second split word line of a high state;
(i) during a ninth time interval, generating the first and second split word lines of a low state; and
(j) repeating steps (f)–(i) at least once until the Y-address signal changes again.

44. The method of claim 42, wherein when the nonvolatile ferroelectric memory device is in the write mode, the method further comprising the steps of:
(f) repeating steps (a)–(e) until X, Z address signal changes and therefrom X, Z-ATD signal changes to a high state; and
(g) repeating step (f) at least once after the X, Z address signal changes again.

45. The method of claim 42, wherein when the nonvolatile ferroelectric memory device is in the read mode, the method further comprising the steps of:
(f) from the time that a first address signal is firstly changed to the time that the first address signal is secondly changed, maintaining the states of first and second split word lines, and the first, second and third control signals of the fifth time interval; and
(g) after the time that the first address signal is secondly changed, repeating step (f) at least once.

46. The method of claim 45, wherein the first address signal is one of a Y-address signal and a X, Z address signal.

* * * * *